United States Patent
Uchida et al.

(10) Patent No.: US 8,125,005 B2
(45) Date of Patent: Feb. 28, 2012

(54) SEMICONDUCTOR ELEMENT AND METHOD FOR MANUFACTURING SAME

(75) Inventors: Masao Uchida, Hyogo (JP); Koichi Hashimoto, Hyogo (JP); Masashi Hayashi, Hyogo (JP)

(73) Assignee: Panasonic Corporation, Osaka (JP)

( * ) Notice: Subject to any disclaimer, the term of this patent is extended or adjusted under 35 U.S.C. 154(b) by 520 days.

(21) Appl. No.: 12/300,352

(22) PCT Filed: May 17, 2007

(86) PCT No.: PCT/JP2007/060108
§ 371 (c)(1),
(2), (4) Date: Nov. 11, 2008

(87) PCT Pub. No.: WO2007/135940
PCT Pub. Date: Nov. 29, 2007

(65) Prior Publication Data
US 2009/0101918 A1    Apr. 23, 2009

(30) Foreign Application Priority Data
May 18, 2006  (JP) .................................. 2006-139128

(51) Int. Cl.
*H01L 27/148* (2006.01)
(52) U.S. Cl. .................. 257/206; 257/213; 257/618
(58) Field of Classification Search .................. 257/206, 257/213, 618
See application file for complete search history.

(56) References Cited

U.S. PATENT DOCUMENTS

| 5,025,299 A | 6/1991 | Arnould |
| 6,573,534 B1 | 6/2003 | Kumar et al. |
| 2005/0012143 A1 | 1/2005 | Tanaka et al. |

FOREIGN PATENT DOCUMENTS

| JP | 11-266017 | 9/1999 |
| JP | 2001-094098 | 4/2001 |
| JP | 2002-373987 | 12/2002 |
| JP | 2004-288890 | 10/2004 |
| JP | 2005-019494 | 1/2005 |
| JP | 2006-032411 | 2/2006 |
| JP | 2006-059940 | 3/2006 |

OTHER PUBLICATIONS

Sei-Hyung Ryu et al., "4H-SiC DMOSFETs for High Speed Switching Applications", Materials Science Forum, vols. 483-485, 2005, pp. 797-800.
International Search Report for corresponding Application No. PCT/JP2007/060108 dated Jul. 31, 2007.

*Primary Examiner* — Samuel Gebremariam
(74) *Attorney, Agent, or Firm* — Renner, Otto, Boisselle & Sklar, LLP

(57) ABSTRACT

A semiconductor device includes: a semiconductor layer 10; a semiconductor region 15*s* of a first conductivity type defined on the surface 10*s* of the semiconductor layer; a semiconductor region 14*s* of a second conductivity type defined on the surface 10*s* of the semiconductor layer to surround the semiconductor region 15*s*; and a conductor 19 with a conductive surface 19*s* to contact with the semiconductor regions 15*s* and 14*s*. The semiconductor layer 10 includes silicon carbide. At least one of the semiconductor region 15*s* and the conductive surface 19*s* is not circular. The semiconductor region 15*s* and the conductive surface 19*s* are shaped such that as the degree of misalignment between the conductive surface 19*s* and the semiconductor region 15*s* increases from zero through one-third of the width of the conductive surface 19*s*, a portion of the profile of the conductive surface 19*s* that crosses the semiconductor region 15*s* has smoothly changing lengths.

15 Claims, 15 Drawing Sheets

FIG.1
(a)
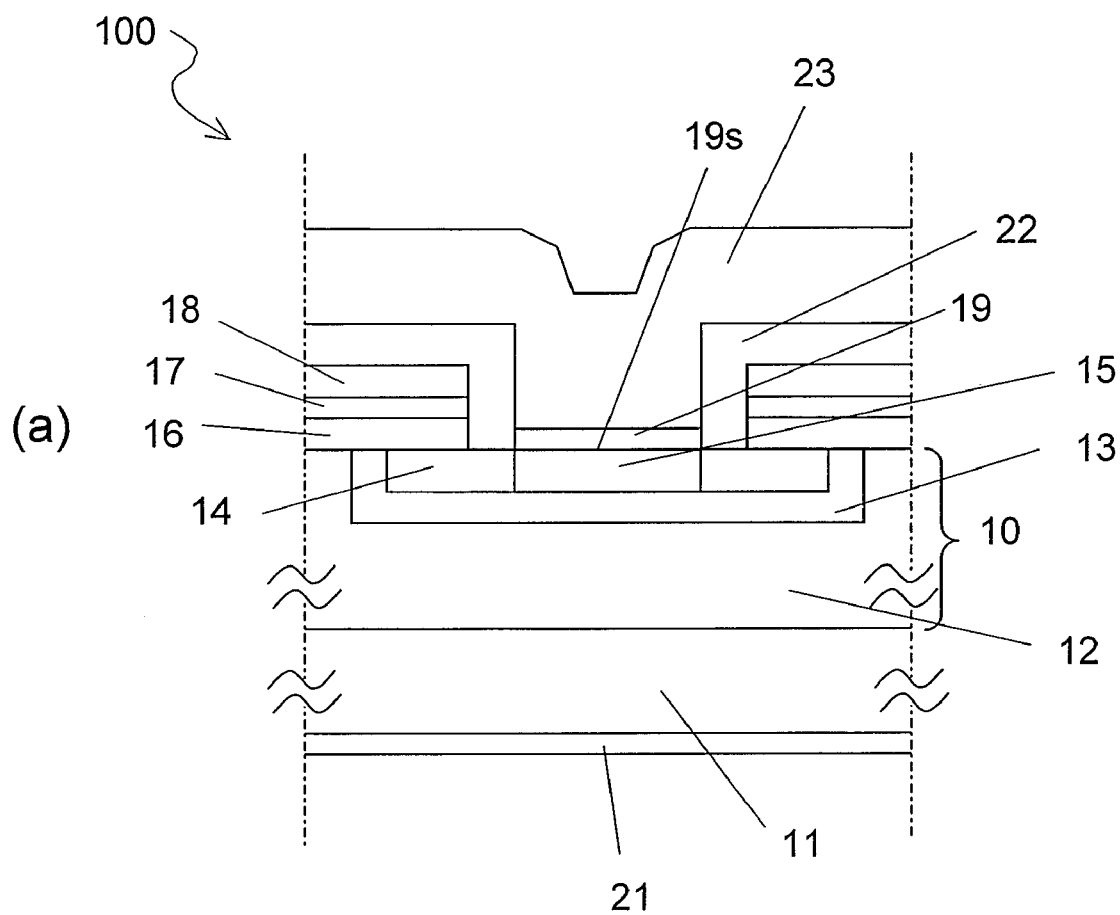
(b)
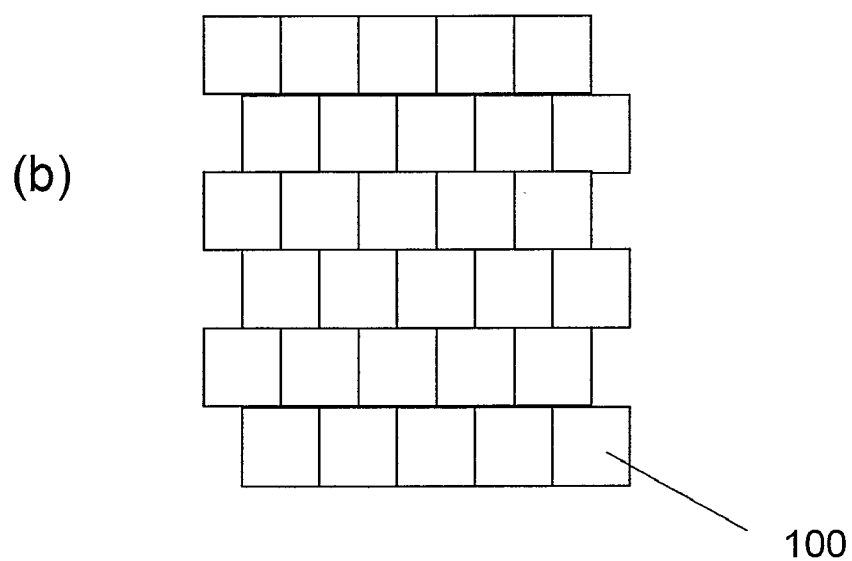

FIG. 7
(a)
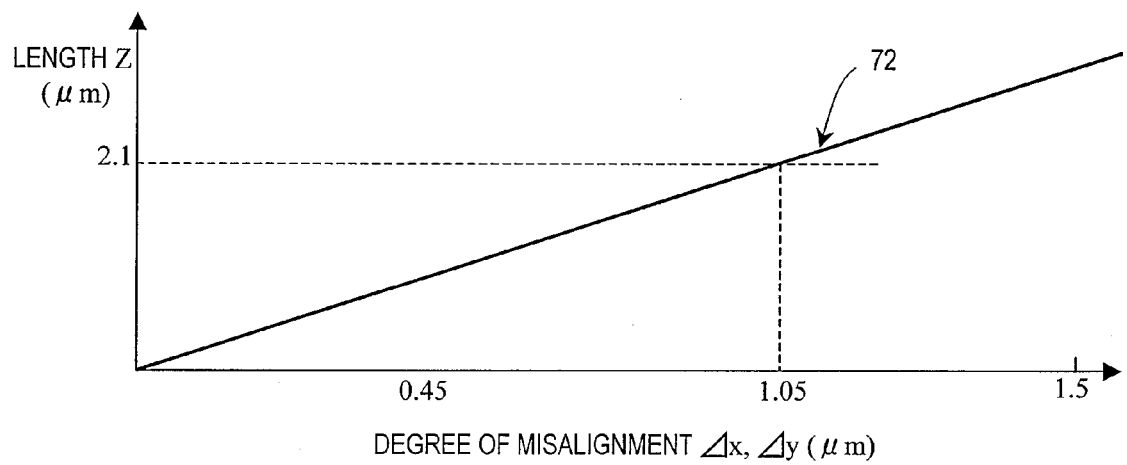
(b)
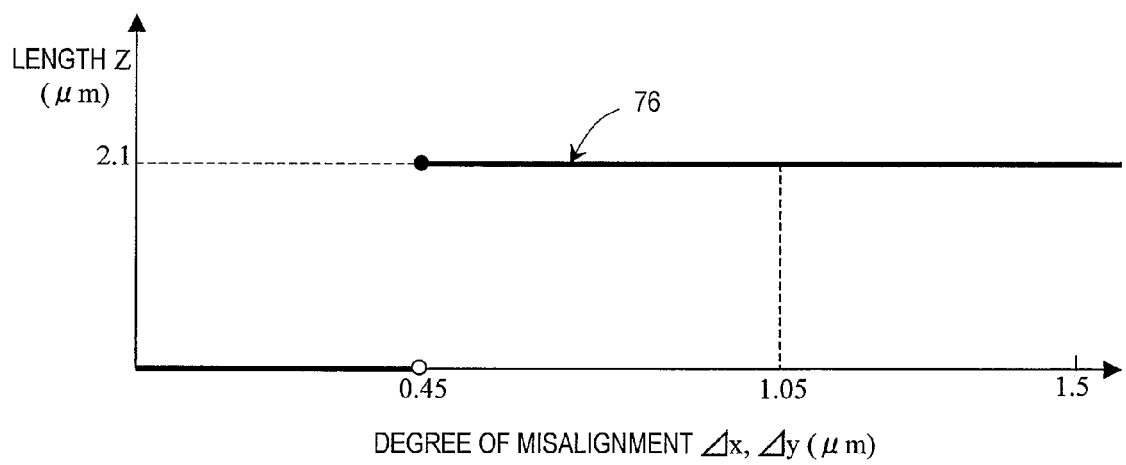

FIG.13
(a)
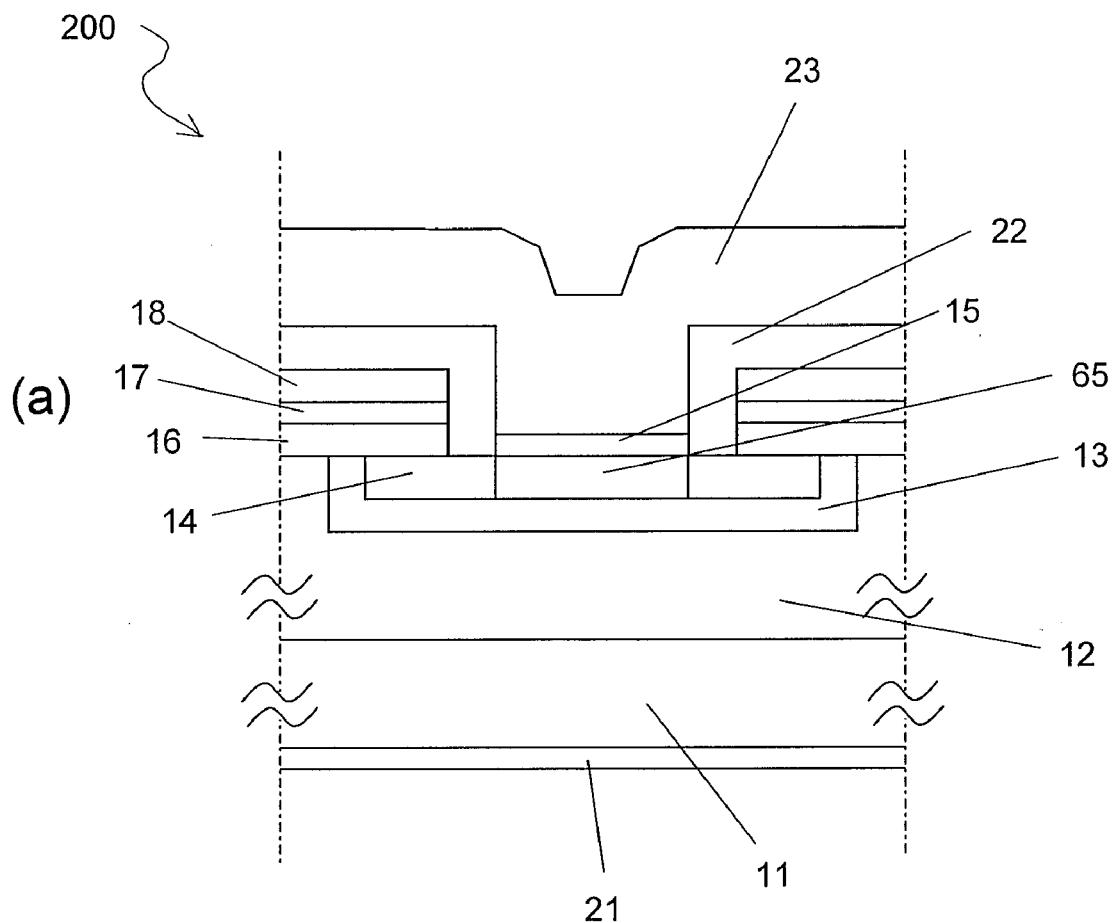
(b)
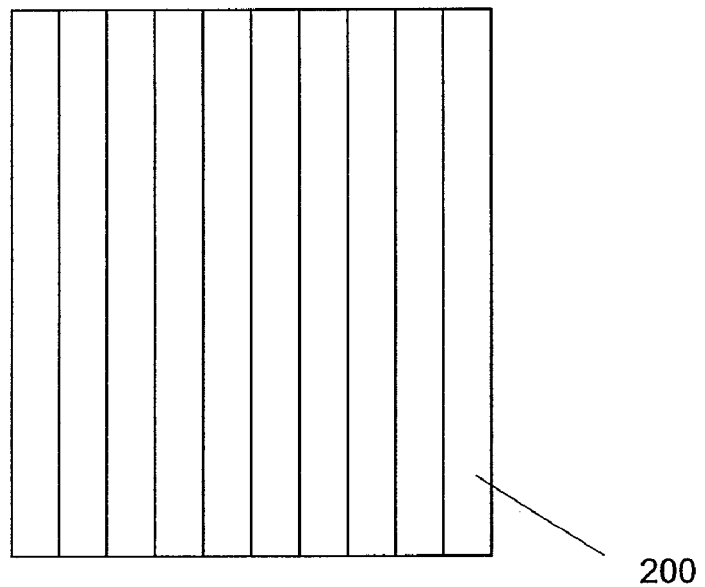

FIG.14
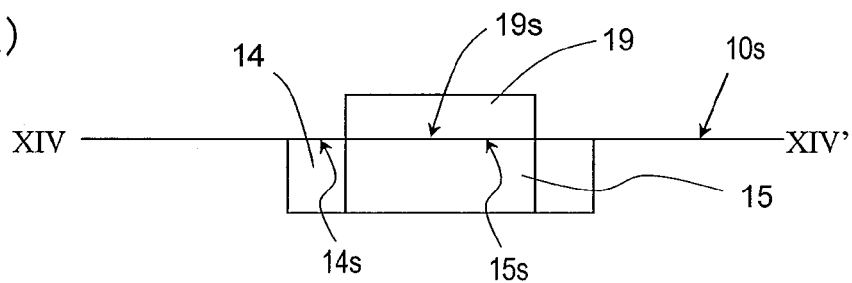
(a)
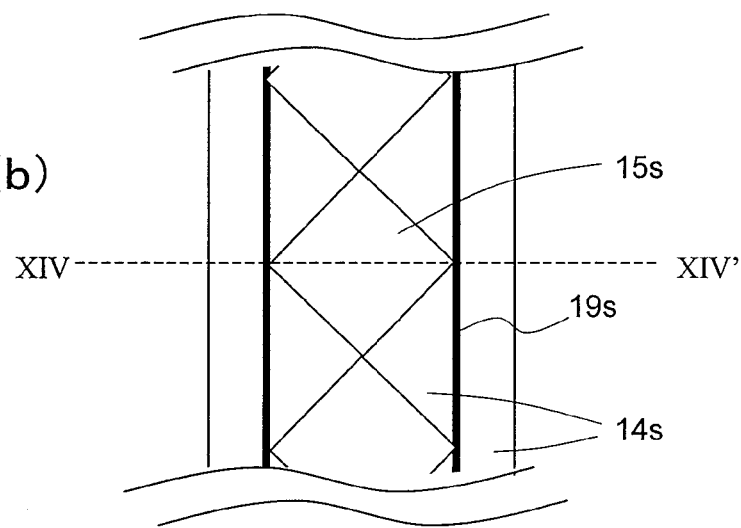
(b)
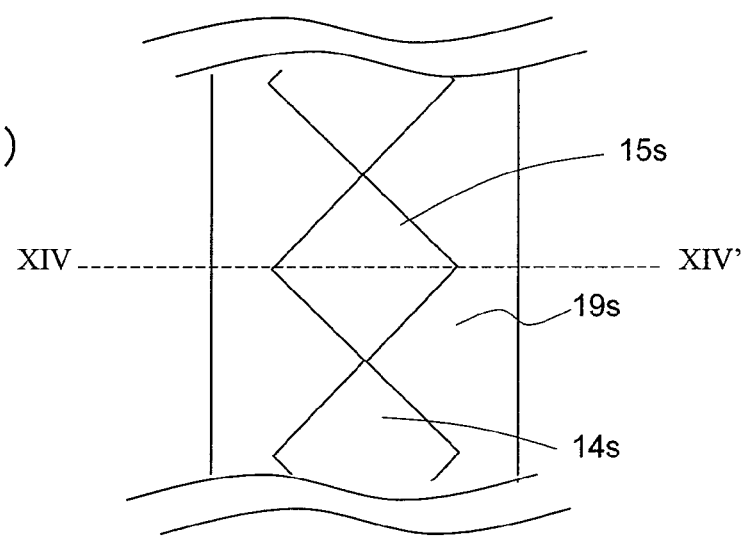
(c)

SEMICONDUCTOR ELEMENT AND METHOD FOR MANUFACTURING SAME

TECHNICAL FIELD

The present invention relates to a semiconductor device and a method for fabricating the same.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements such as switching elements and rectifiers has attracted a lot of attention. This is because a power element that uses SiC can significantly reduce the power loss compared to a Si power element.

Among various power elements that use SiC, switching elements such as a MOSFET and a MESFET are known as typical ones. Such a switching element can switch between ON state in which drain current of several amperes (A) or more flows and OFF state in which the drain current becomes zero by changing the voltages applied to its gate electrode. Also, in the OFF state, SiC will achieve as high a breakdown voltage as several hundreds of volts or more.

The structures of such a switching element that uses SiC are proposed in Patent Document No. 1 and Non-Patent Document No. 1, for example. Hereinafter, the structure of vertical MOSFETs proposed in those documents will be described with reference to the accompanying drawings.

FIG. 17 is a schematic cross-sectional view illustrating a unit cell 1000 of a vertical MOSFET that uses SiC. It should be noted that a vertical MOSFET typically has a plurality of unit cells.

The unit cell 1000 of the vertical MOSFET includes a silicon carbide epitaxial layer 120 that has been formed on the principal surface of an n-type SiC substrate 101 with low resistivity, a channel layer 106 that has been formed on the silicon carbide epitaxial layer 120, a gate electrode 108 that is arranged over the channel layer 106 with a gate insulating film 107 interposed between them, a source electrode 109 that contacts with the surface 120s of the silicon carbide epitaxial layer, and drain electrode 110 arranged on the back surface of the SiC substrate 101.

The silicon carbide epitaxial layer 120 has a well region 103, of which the conductivity type (i.e., p-type in this example) is different from that of the SiC substrate 101, and a drift region 102, which is the rest of the silicon carbide epitaxial layer 120 other than the well region 103. More specifically, the drift region 102 is an n$^-$-type silicon carbide layer including an n-type dopant, of which the concentration is lower than in the SiC substrate 101. Inside the well region 103, defined are an n-type heavily doped source region 104 including an n-type dopant and a p$^+$-type contact region 105 that includes a p-type dopant at a higher concentration than the well region 103. The well region 103, the source region 104 and the contact region 105 are defined by performing the process step of implanting dopants into the silicon carbide epitaxial layer 120 and a high-temperature heat treatment process step (i.e., activating annealing process step) that activates the dopants that have been introduced into the silicon carbide epitaxial layer 120.

The source region 104 and the drift region 102 are connected together through the channel layer 106, which may be a 4H-SiC layer that has been formed on the silicon carbide epitaxial layer 102 by an epitaxy process, for example. Also, the contact region 105 and the source region 104 make ohmic contact with the source electrode 109. Consequently, the well region 103 is electrically connected to the source electrode 109 via the contact region 105.

The source electrode 109 can be formed by depositing a conductive material such as Ni on the source region 104 and the contact region 105 of the silicon carbide epitaxial layer 120 and then annealing the material at a high temperature.

The gate insulating film 107 may be a thermal oxide film (i.e., SiO$_2$ film) that has been formed by heating and oxidizing the surface of the channel layer 106, for example. The gate electrode 108 may be made of electrically conductive polysilicon, for example.

The gate electrode 108 is covered with an interlevel dielectric film 111 with a hole 113. Through this hole 113, the source electrode 109 of each unit cell is connected in parallel to an upper interconnect electrode (e.g., an Al electrode) 112.

In a MOSFET including the unit cell 1000 with the structure shown in FIG. 17, the source electrode 109 should make ohmic contact with the source region 104, which is an n-type semiconductor region, and with the contact region 105, which is a p-type semiconductor region, as described above. The reason will be described below.

In this MOSFET, current can be produced in the channel layer 106 that is located under the gate electrode 108 by applying a voltage to the gate electrode 108. Thus, current originating from the drain electrode 110 (i.e., drain current) flows through the SiC substrate 101, the drift region 102, the channel layer 106 and the source region 104 into the source electrode 109 (in ON state). In this case, if the contact resistance between the source region 104 and the source electrode 109 were too high, then the resistance in the ON state (i.e., ON-state resistance) would increase too much to make a sufficient amount of drain current flow. That is why the source region 104 and the source electrode 109 should have a sufficient contact area between them and should also make ohmic contact to have reduced contact resistance between them. Such a MOSFET is often built in an electrical circuit such as an inverter or a converter. An electrical circuit with such a coil, however, will produce induced current during switching. For that reason, when the MOSFET is switched, that induced current may sometimes flow from the drain electrode 110 into the upper interconnect electrode 112 by way of the contact region 105 and the source electrode 109. In that case, if the contact resistance between the source electrode 109 and the contact region 105 were high, a bipolar transistor, consisting of the source region 104, the well region 103 and the drift region 102, would be turned ON. Then, part of the induced current could fail to flow toward the source electrode 109 but a huge amount of current would flow instantaneously around the channel layer 106, thus possibly damaging the channel or gate portion of the MOSFET. For that reason, the source electrode 109 should have a sufficient area of contact with not only the source region 104 but also the contact region 105 and should make good ohmic contact with them.

To secure a sufficient area of contact between the source electrode 109 and the source region 104 and between the source electrode 109 and the contact region 105, the source electrode 109, the source region 104 and the contact region 105 may be designed in the following manner.

Portion (a) of FIG. 18 is a schematic cross-sectional view illustrating the source electrode 109, the contact region 105 and the source region 104 of the unit cell 1000 shown in FIG. 17. Portion (b) of FIG. 18 is a plan view illustrating the surface 120s of the silicon carbide epitaxial layer, on which the surface 105s of the contact region 105, the surface 104s of the source region 104 and the lower surface (conductive surface) 109s of the source electrode 109 arranged on the surface 120s of the silicon carbide epitaxial layer are shown. In the following description, the surface 105s of the contact region 105, the surface 104s of the source region 104 and the conductive surface 109s of the source electrode 109 will be simply referred to herein as "contact region's surface 105s", "source region's surface 104s" and "conductive surface 109s", respectively.

As shown in FIG. 18, on the surface 120s of the silicon carbide epitaxial layer, the contact region 105 is surrounded with the source region 104. The profiles of the source region's surface 104s and the contact region's surface 105s are both quadrangular. The conductive surface 109s of the source electrode 109 has a quadrangular shape, which is analogous in shape to, and bigger in size than, the contact region's surface 105s. The conductive surface 109s is arranged so as to cover the contact region's surface 105s. That is why the center portion of the conductive surface 109s is in contact with the contact region's surface 105s and the peripheral portion thereof is in contact with the source region's surface 104s. With such an arrangement, the conductive surface 109s and the source region 104 can have a sufficient area of contact between them. As a result, when the MOSFET is turned ON, electrons can flow from the conductive surface 109s of the source electrode 109 toward the entire surrounding surface 104s of the source region as indicated by the arrows 119. In addition, since the conductive surface 109s can also have a sufficient area of contact with the contact region 105, it is possible to prevent induced current from damaging the channel or gate portion.

In such a MOSFET, the source electrode 109 may be formed in the following manner.

First, a conductive material film of Ni, for example, is deposited on the silicon carbide epitaxial layer 120 in which the source region 104 and the contact region 105 have been defined. Next, the conductive material film is patterned by a photolithographic process, thereby forming a conductive material layer. In this process step, the alignment is done such that the lower surface of the conductive material layer to be the conductive surface 109s contacts with the source region's surface 104s and the contact region's surface 105s as already described with reference to portion (b) of FIG. 18. Thereafter, a post-deposition annealing process is carried out normally at a high temperature of about 1,000° C., thereby obtaining a source electrode 109. According to this method, a reaction layer is formed in the interface between the conductive material layer and the source region 104 and between the conductive material layer and the contact region 105 as a result of the high-temperature annealing process. For that reason, the source electrode 109 thus obtained will have good ohmic property with respect to these regions 104 and 105. As used herein, the "source electrode" may refer herein to either a conductive layer including the reaction layer that has been formed in that interface or only the reaction layer.

Patent Document No. 1: Japanese Patent Application Laid-Open Publication No. 11-266017

Non-Patent Document No. 1: S. H. Ryu et al., Materials Science Forum, Vols. 483-485 (2005), pp. 797-800

DISCLOSURE OF INVENTION

Problems to be Solved by the Invention

In the MOSFET shown in FIG. 17, the source electrode 109 is aligned with respect to the contact region 105 and the source region 104 in the silicon carbide epitaxial layer 102 by performing a photolithographic process as described above. Generally speaking, however, a critical dimension shift or a misalignment may occur in a photolithographic process.

Among these types of errors, the "critical dimension shift" refers to the deviation of the planar sizes of the source electrode 109 from its designed values and can be reduced by optimizing the sizes of a photomask for use in the photolithographic process or the exposure conditions thereof. On the other hand, the "misalignment" refers to the deviation of the actual location of the source electrode 109 from the expected one due to the misalignment of the photomask with a resist film. As long as a known exposure system is used, it is difficult to avoid the misalignment perfectly. Specifically, a misalignment of about 1 to 2 μm is inevitable when a contact aligner is used and a misalignment of approximately 0.1 to 0.2 μm will be caused by the use of a stepper.

If such a misalignment occurred in the photolithographic process to form the source electrode 109, then the conductive surface 109s of the source electrode 109 could not be arranged at the location shown in portion (b) of FIG. 18.

The present inventors carried out researches on how the characteristics of a MOSFET varied with such a misalignment of the source electrode 109. The results are as follows.

Portions (a) and (b) of FIG. 19 are respectively a schematic cross-sectional view of the source electrode 109, contact region 105 and source region 104 and a plan view of the surface 120s of the silicon carbide epitaxial layer in a situation where a misalignment has occurred in the source electrode 109 of a MOSFET that was designed as shown in portions (a) and (b) of FIG. 18.

If the conductive surface 109s of the source electrode 109 has shifted to the right (in the x direction) by Δx to have one end thereof located over the contact region's surface 105s as shown in FIG. 19, then a portion of the source region's surface 104s that is located on the left-hand side of the contact region's surface 105s will no longer be in contact with the conductive surface 109s. As a result, the source region's surface 104s comes to have a zone X in which almost no electrons coming from the source electrode 109 flow as shown in portion (b) of FIG. 19. It should be noted that the "zone X in which almost no electrons flow" means a zone in which electrons flow less smoothly than any other zone of the source region's surface 104s. That is to say, a smaller number of electrons may flow through that zone X than the rest of the source region's surface 104s. Since the source region 104 has low electrical resistance, some of the electrons coming from the source electrode 109 will go around the source region 104 as indicated by the arrows 122 to reach the leftmost portion of the source region's surface 104s. However, no electrons will flow around the center Xa of the leftmost portion of the source region's surface 104s. Generally speaking, the length of a peripheral edge of the source region's surface 104s corresponds to the "gate width", which is one of the parameters that define the transistor characteristics of a MOSFET unit cell. Even if that length remains the same but if there is such a portion Xa where no electrons flow at one end of the source region's surface 104s, then the outcome will be the same as a situation where the effective gate width has decreased. Consequently, the ON-state resistance increases, and therefore, the ON-state current decreases. In this example, the conductive surface 109s is supposed to shift in the x direction. However, the same statement applies to even a situation where the conductive surface 109s shifts in the −x direction or in the y or −y direction that intersects with the x direction at right angles.

As described above, in the MOSFET shown in FIG. 17, the greater the degree of misalignment, the higher the ON-state resistance and the lower the performance of the MOSFET. On top of that, a variation in ON-state resistance will be caused between MOSFET products due to the misalignment, and high reliability will not be achieved.

In order to overcome the problems described above, the present invention has an object of avoiding such deterioration in the performance of a semiconductor device, including n- and p-type semiconductor regions on the surface of a semiconductor layer and a conductor with a conductive surface that contacts with those semiconductor regions, even in a situation where the conductive surface has misaligned with the semiconductor regions.

Means for Solving the Problems

A semiconductor device according to the present invention includes: a semiconductor layer; a semiconductor region of a first conductivity type, which is defined on the surface of the semiconductor layer; a semiconductor region of a second conductivity type, which is defined on the surface of the semiconductor layer so as to surround the semiconductor region of the first conductivity type; and a conductor with a conductive surface to contact with the semiconductor regions of the first and second conductivity types. The semiconductor layer includes silicon carbide. At least one of the semiconductor region of the first conductivity type and the conductive surface is not circular on a plan view. The semiconductor region of the first conductivity type and the conductive surface are shaped such that as the degree of misalignment between the conductive surface and the semiconductor region of the first conductivity type increases from zero through one-third of the width of the conductive surface, a portion of the profile of the conductive surface that crosses the semiconductor region of the first conductivity type has smoothly changing lengths.

In one preferred embodiment, on a plan view, the conductive surface and the semiconductor region of the first conductivity type are quadrangular, and the conductive surface has a side that defines an angle of 30 to 60 degrees with respect to its associated side of the semiconductor region of the first conductivity type.

In a specific preferred embodiment, the conductive surface and the semiconductor region of the first conductivity type may be square.

In this particular preferred embodiment, the angle formed between the side of the conductive surface and its associated side of the semiconductor region of the first conductivity type may be approximately 45 degrees.

In another preferred embodiment, each vertex of the semiconductor region of the first conductivity type may overlap with its associated side of the conductive surface.

In still another preferred embodiment, as the degree of misalignment between the conductive surface and the semiconductor region of the first conductivity type increases from zero through one-third of the width of the conductive surface, multiple portions of the profile of the conductive surface cross the semiconductor region of the first conductivity type and each of those crossing portions has smoothly changing lengths.

In this particular preferred embodiment, on a plan view, the conductive surface and the semiconductor region of the first conductivity type are quadrangular. A plurality of semiconductor regions of the first conductivity type are arranged under the conductive surface. And the conductive surface has a side that defines an angle of 30 to 60 degrees with respect to its associated side of the semiconductor regions of the first conductivity type.

In a specific preferred embodiment, the conductive surface may be rectangular and the semiconductor regions of the first conductivity type may be arranged parallel to the longer sides of the rectangle.

In a more specific preferred embodiment, the semiconductor regions of the first conductivity type may be square.

In that case, the angle formed between the side of the conductive surface and its associated side of the semiconductor regions of the first conductivity type may be approximately 45 degrees.

In yet another preferred embodiment, at least one vertex of each said semiconductor region of the first conductivity type overlaps with its associated side of the conductive surface.

In yet another preferred embodiment, on a plan view, the conductive surface is quadrangular and the semiconductor region of the first conductivity type includes a plurality of square portions that are arranged so as to be spaced from each other and connecting portions, each connecting its associated pair of adjacent square portions. The conductive surface has a side that defines an angle of 30 to 60 degrees with respect to its associated side of the square portions of the semiconductor region of the first conductivity type.

In this particular preferred embodiment, the conductive surface is rectangular, the square portions of the semiconductor region of the first conductivity type are arranged parallel to the longer sides of the rectangle, and each said connecting portion connects together two opposing vertices of its associated pair of adjacent square portions.

In a specific preferred embodiment, at least one vertex of each said square portion of the semiconductor region of the first conductivity type overlaps with its associated side of the conductive surface.

In yet another preferred embodiment, the semiconductor device further includes: a well region of the first conductivity type, which is electrically connected to the semiconductor region of the first conductivity type and which surrounds the semiconductor region of the second conductivity type on the surface of the semiconductor layer; a gate insulating film, which partially covers the semiconductor layer; a gate electrode, which is electrically insulated from the semiconductor layer by the gate insulating film; an upper interconnect electrode, which is electrically connected to the conductor; and a drain electrode, which is arranged on the back surface of the substrate.

A method for fabricating a semiconductor device according to the present invention includes the steps of: (A) implanting a dopant of a first conductivity type into a semiconductor layer, including silicon carbide, through a first implantation mask, thereby defining a semiconductor region of the first conductivity type on the surface of the semiconductor layer; (B) implanting a dopant of a second conductivity type into the semiconductor layer through a second implantation mask, thereby defining a semiconductor region of the second conductivity type on the surface of the semiconductor layer; and (C) arranging a conductor with a conductive surface. By performing the steps (A) and (B), a structure in which the semiconductor region of the first conductivity type is surrounded with the semiconductor region of the second conductivity type is obtained. The step (C) includes the step of aligning the conductive surface with respect to the semiconductor region of the first conductivity type such that the conductive surface contacts with the semiconductor regions of the first and second conductivity types. On a plan view, at least one of the semiconductor region of the first conductivity type and the conductive surface is not circular. The semiconductor region of the first conductivity type and the conductive surface are shaped such that as the degree of misalignment between the conductive surface and the semiconductor region of the first conductivity type increases from zero through one-third of the width of the conductive surface, a portion of the profile of the conductive surface that crosses the semiconductor region of the first conductivity type has smoothly changing lengths.

EFFECTS OF THE INVENTION

In a semiconductor device according to the present invention, including n- and p-type semiconductor regions on the surface of a semiconductor layer and a conductor with a conductive surface that contacts with those semiconductor regions, even if the conductive surface has misaligned with the semiconductor regions, the deterioration in performance due to the misalignment can be minimized. As a result, the present invention always guarantees device performance at an acceptable level.

Particularly when the present invention is applied to a vertical MOSFET, even if a source electrode being formed on a semiconductor layer by a photolithographic process has misaligned with a contact region that has been defined on the surface of the semiconductor layer, a substantial decrease in gate width can be avoided, and therefore, the decrease in ON-state resistance or ON-state current that could be caused by the misalignment can be minimized. On top of that, the variation in ON-state resistance between products can also be reduced significantly.

Furthermore, according to the present invention, such a semiconductor device can be fabricated without complicating the manufacturing process.

BRIEF DESCRIPTION OF DRAWINGS

FIGS. 1(a) and 1(b) are respectively a schematic cross-sectional view illustrating a unit cell according to a first preferred embodiment of the present invention and a plan view illustrating an arrangement of the unit cells.

Figure 3:
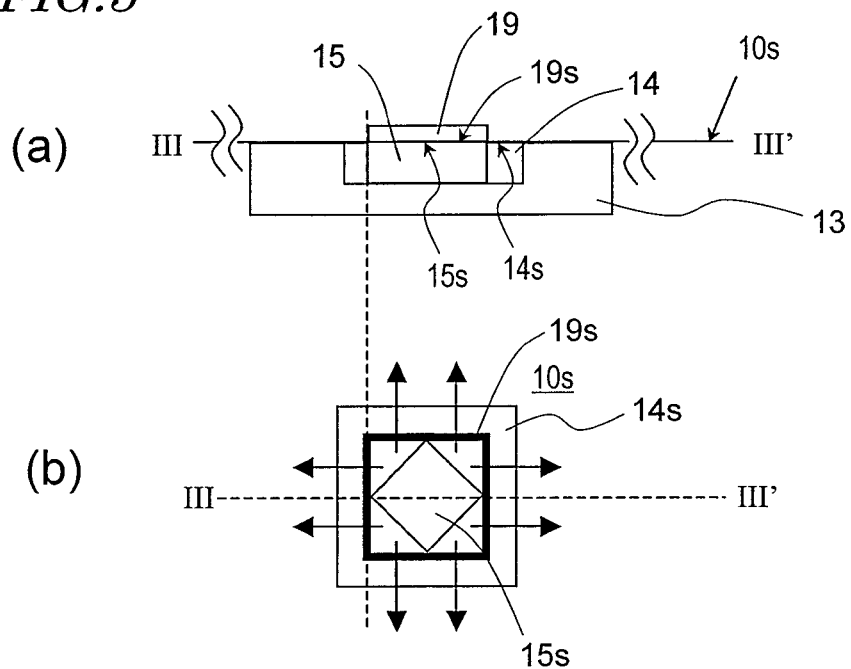

Portions (a) and (b) of FIG. 3 illustrate an ideal situation where the conductive surface 19s of the source electrode 19 has been arranged just as designed on the p$^+$-type contact region's surface 15s and on the source region's surface 14s. Specifically, portion (a) of FIG. 3 is a schematic cross-sectional view illustrating a portion of the unit cell 100, while portion (b) of FIG. 3 is a plan view illustrating the surface 10s of the semiconductor layer.

Figure 4:
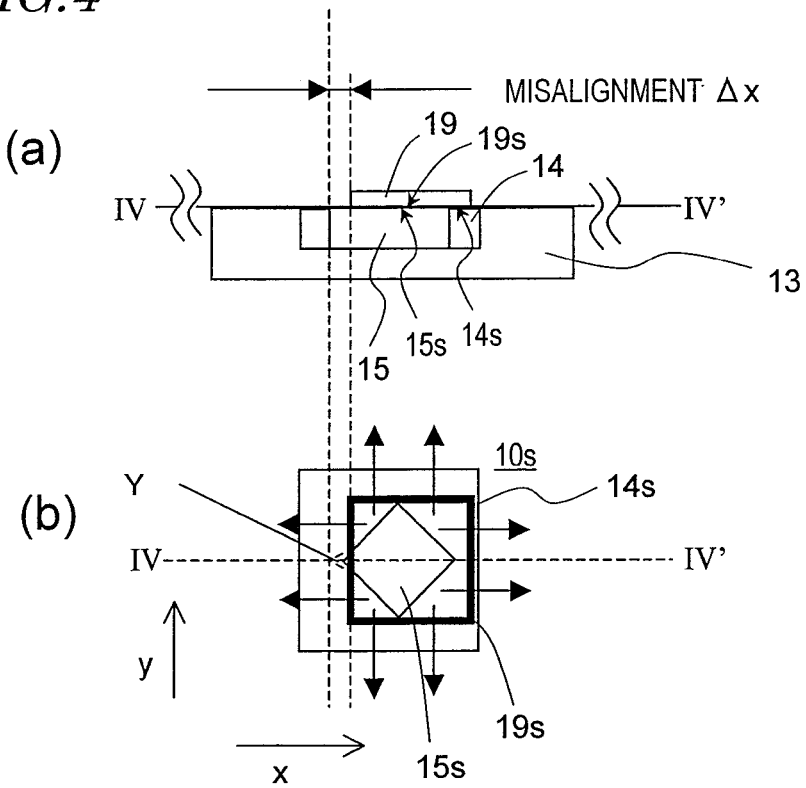

Portions (a) and (b) of FIG. 4 illustrate a situation where the conductive surface 19s of the source electrode 19 has been misaligned to the right by Δx from its designed position. Specifically, portion (a) of FIG. 4 is a schematic cross-sectional view illustrating a portion of the unit cell 100, while portion (b) of FIG. 4 is a plan view illustrating the surface 10s of the semiconductor layer.

Figure 5:
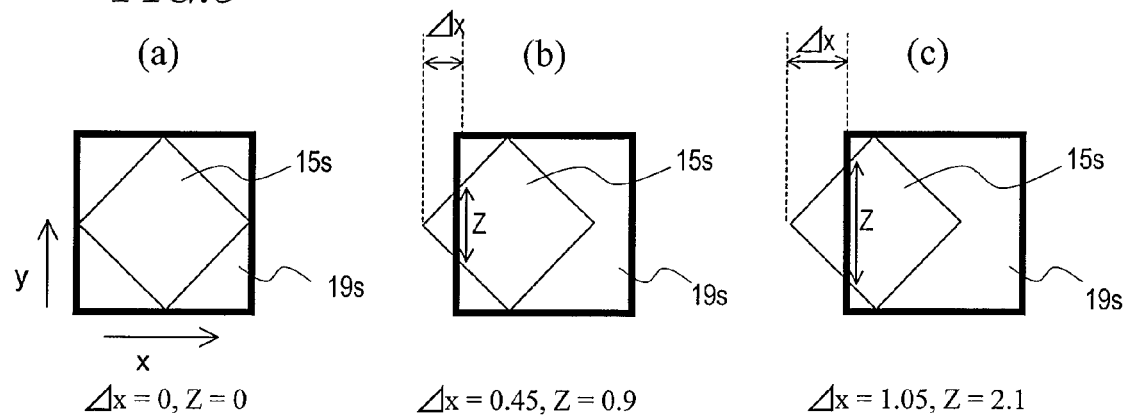

FIGS. 5(a) through 5(c) are plan views illustrating how the arrangement of the conductive surface 19s and the P$^+$-type contact region's surface 15s changes in the semiconductor device of this preferred embodiment as the degrees of misalignment Δx are varied.

Figure 6:
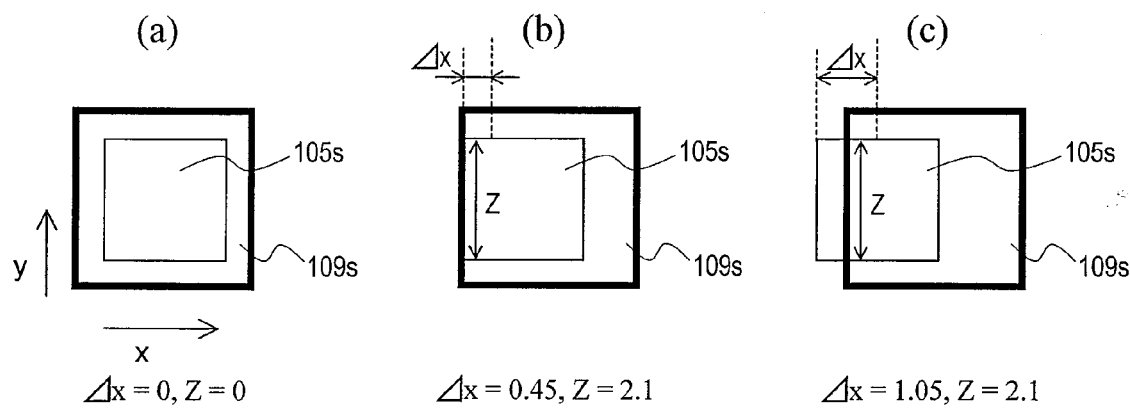

FIGS. 6(a) through 6(c) are plan views illustrating how the arrangement of the conductive surface 109s and the contact region's surface 105s changes in the conventional semiconductor device as the degrees of misalignment Δx are varied.

FIGS. 7(a) and 7(b) are graphs showing how respective portions of the profile of the conductive surfaces 19s and 109s that cross the p$^+$-type contact region's surface 15s, 105s change their lengths Z with the degree of misalignment Δx or Δy in the semiconductor device of the first preferred embodiment and in the conventional semiconductor device, respectively.

Figure 8:
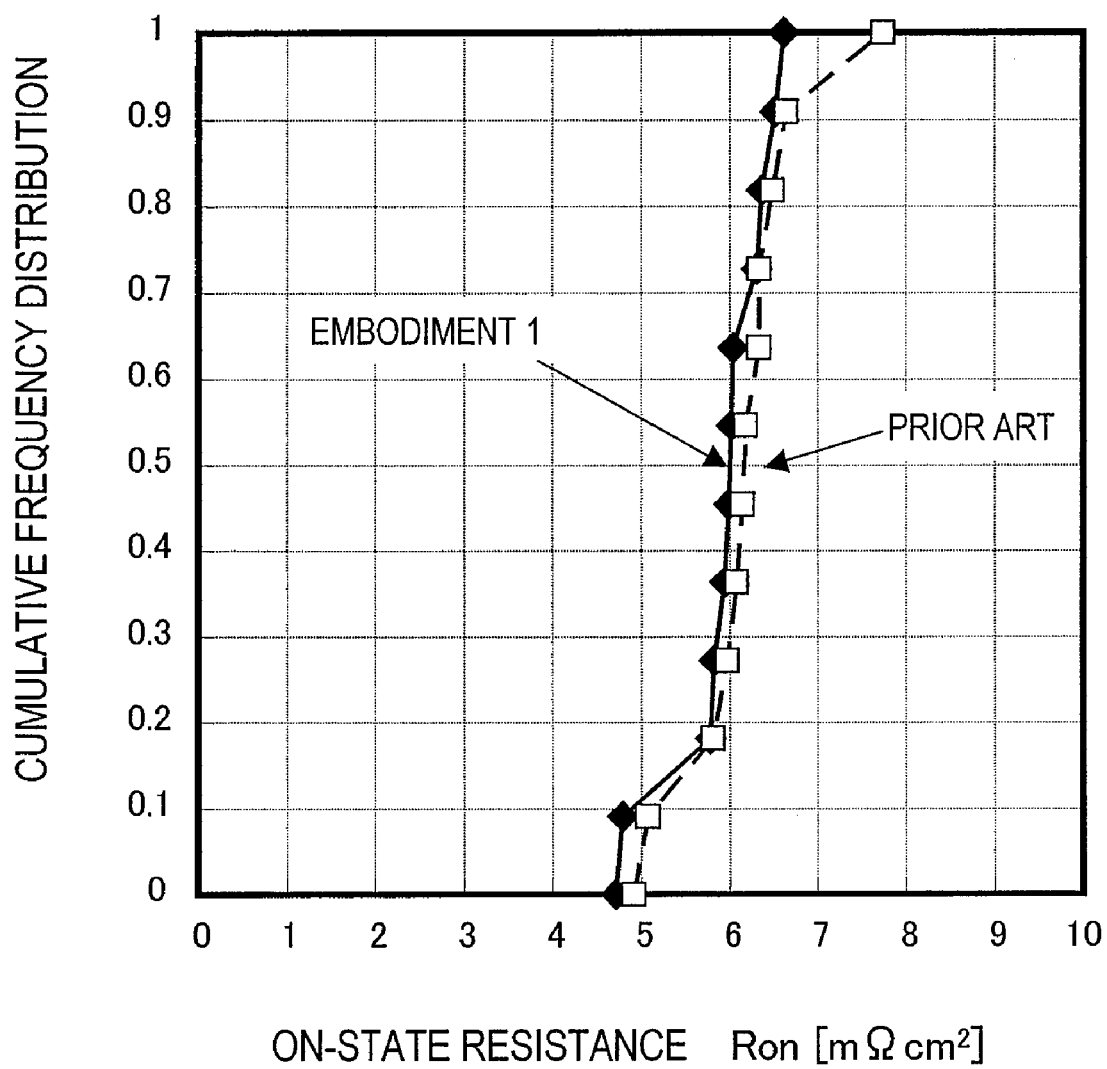
Figure 9:
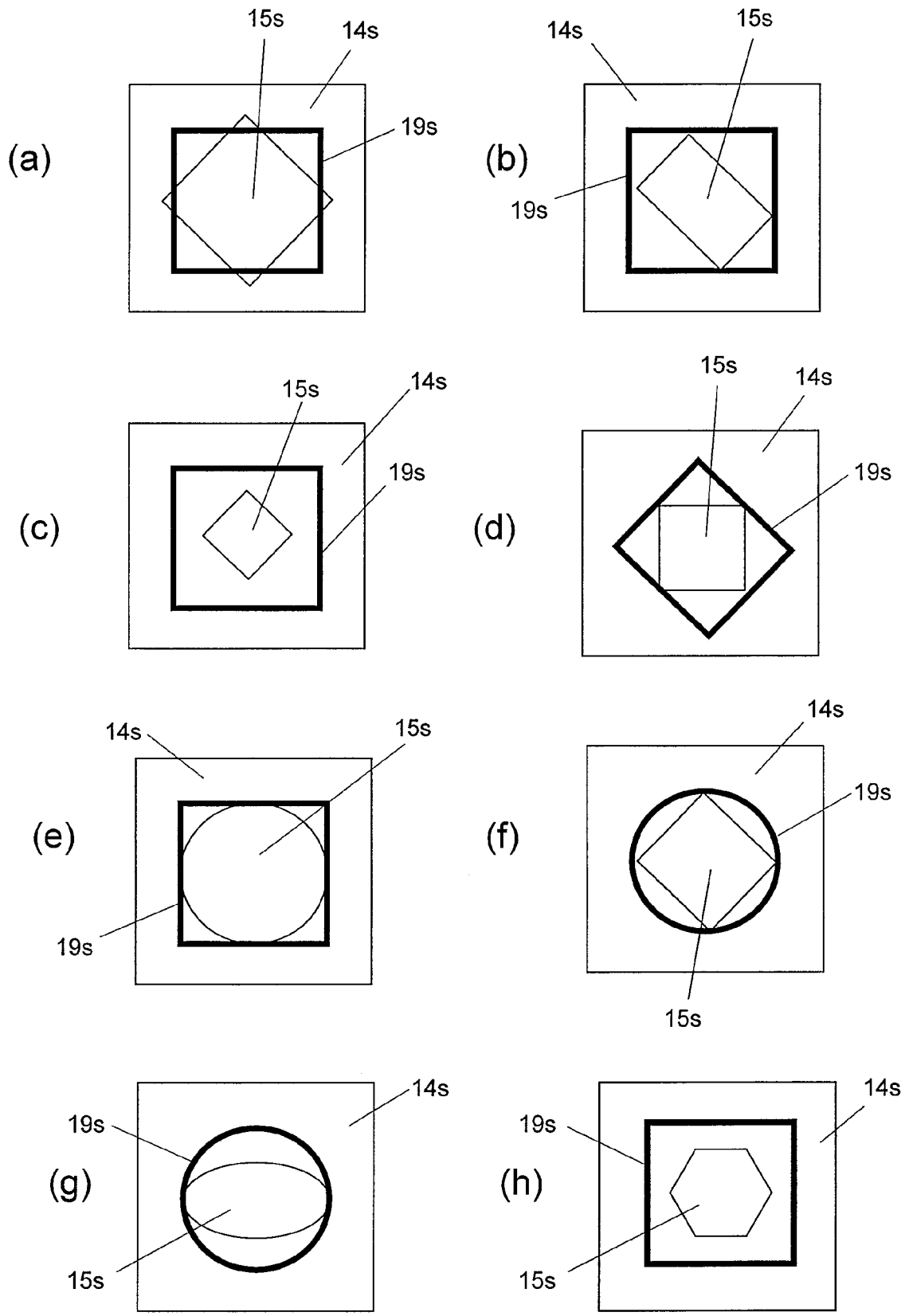

FIG. 8 is a cumulative frequency distribution of the ON-state resistances of the semiconductor device of the first preferred embodiment and the conventional semiconductor device.

FIGS. 9(a) through 9(h) are plan views illustrating other exemplary shapes for the source region's surface 14s, the conductive surface 19s of the source electrode 19, and the p$^+$-type contact region's surface 15s in the first preferred embodiment.

Figure 10:
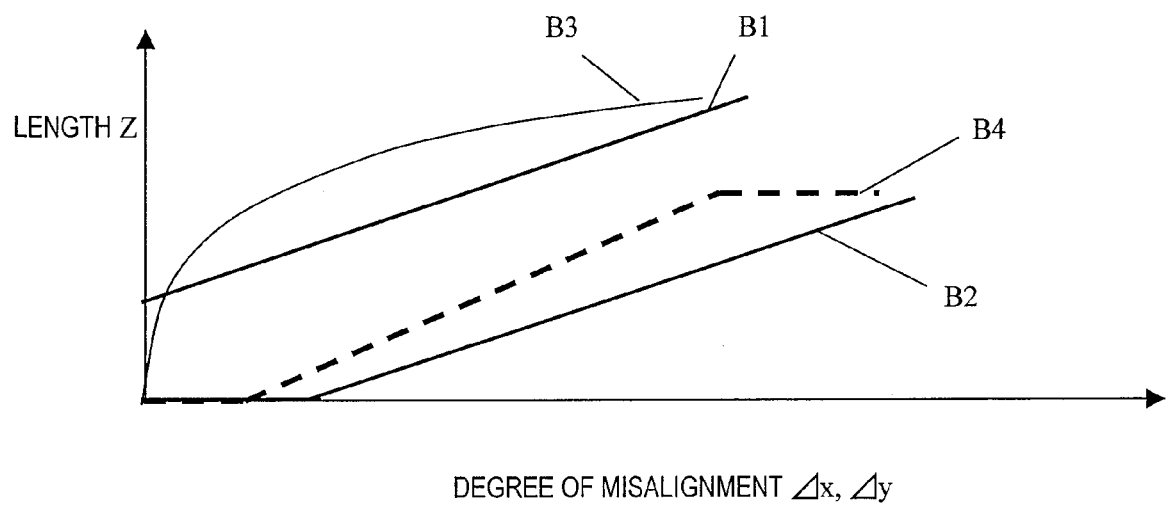

FIG. 10 is a graph showing other relations between the degree of misalignment Δx, Δy and the length Z in the first preferred embodiment.

FIGS. 11(a) through 11(g) are cross-sectional views illustrating respective process steps to make the semiconductor device of the first preferred embodiment.

Figure 12:
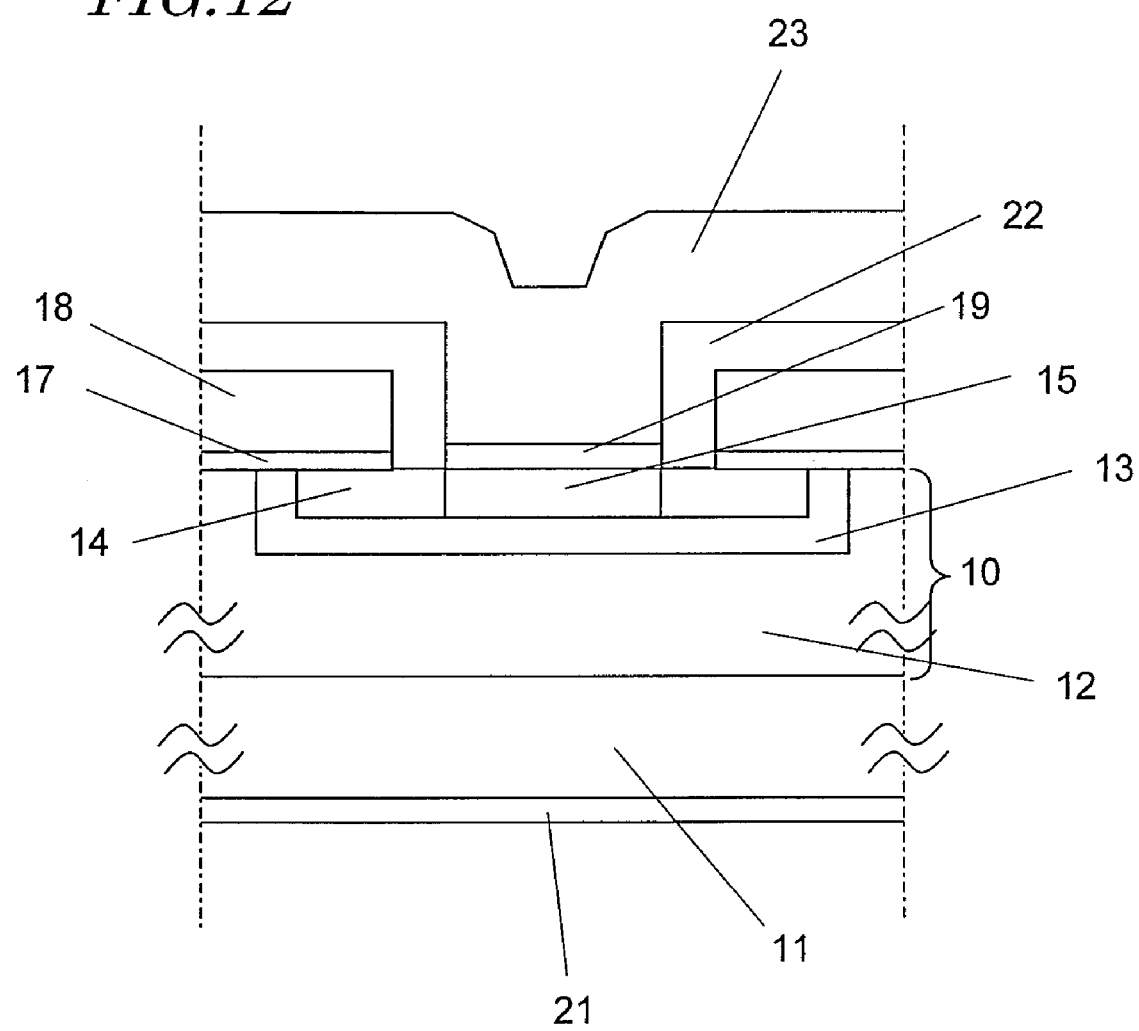

FIG. 12 is a schematic cross-sectional view illustrating an alternative unit cell according to the first preferred embodiment of the present invention.

FIGS. 13(a) and 13(b) are respectively a schematic cross-sectional view illustrating a unit cell according to a second preferred embodiment of the present invention and a plan view illustrating an exemplary arrangement of such unit cells.

FIG. 14(a) is a schematic cross-sectional view illustrating a source electrode 19, a p$^+$-type contact region 15 and an n-type source region 14 according to the second preferred embodiment, FIG. 14(b) is a plan view illustrating an exemplary arrangement of the conductive surface 19s of the source electrode 19, the p$^+$-type contact region's surface 15s and the n-type source region's surface 14s, and FIG. 14(c) is a plan view illustrating exemplary shapes of the p$^+$-type contact region's surface 15s and the n-type source region's surface 14s.

FIGS. 15(a) through 15(f) are plan views illustrating alternative shapes of the source region's surface 14s, the conductive surface 19s of the source electrode 19 and the p$^+$-type contact region's surface 15s according to the second preferred embodiment.

Figure 16:
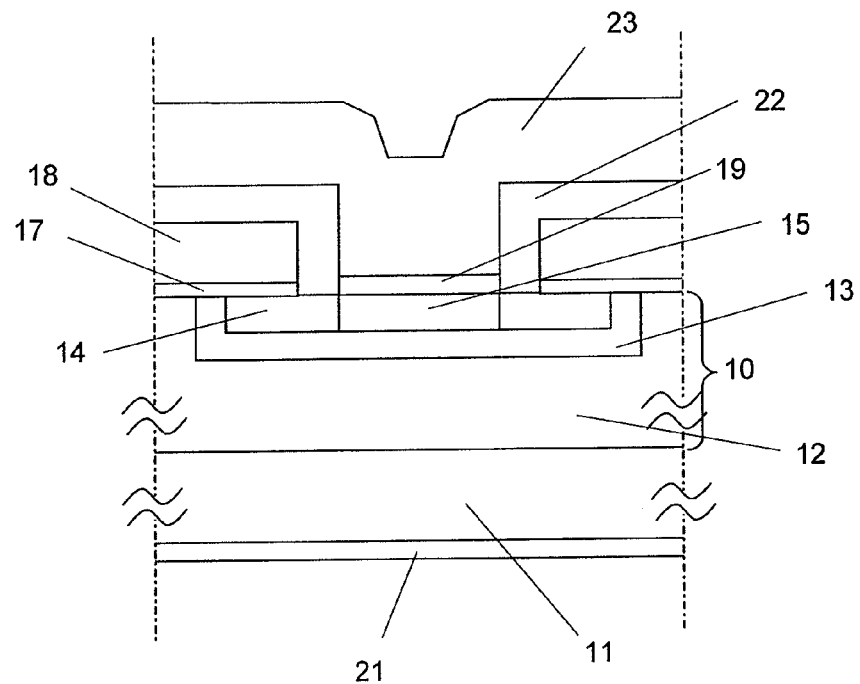

FIG. 16 is a schematic cross-sectional view illustrating an alternative unit cell according to the second preferred embodiment of the present invention.

Figure 17:
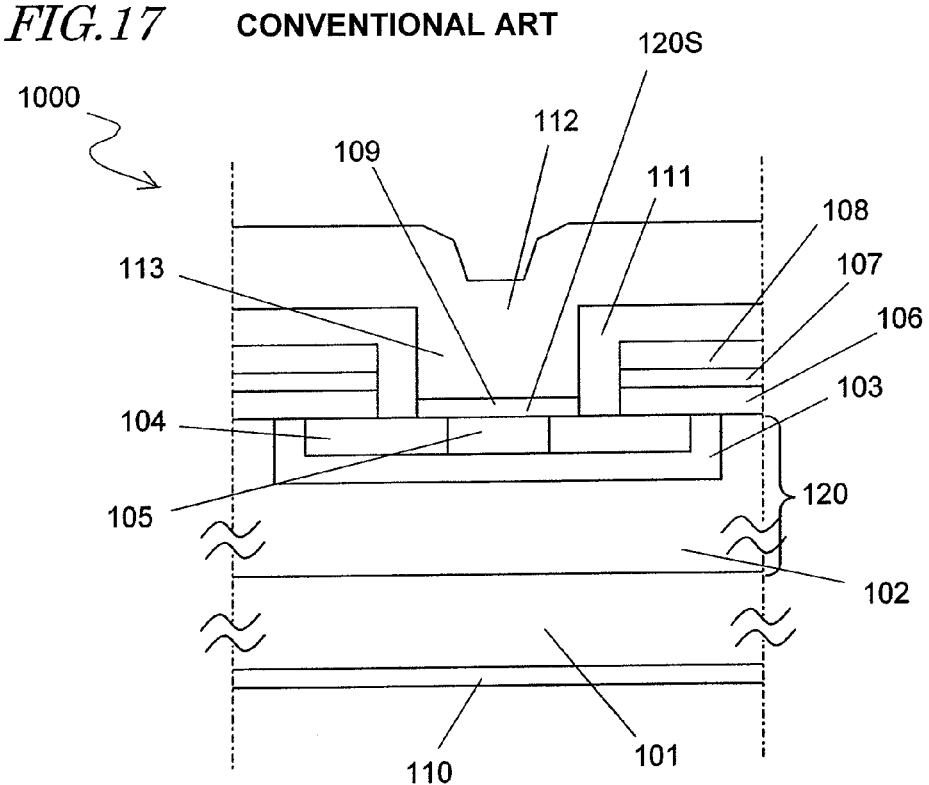

FIG. 17 is a schematic cross-sectional view illustrating a unit cell of a conventional vertical MOSFET that uses silicon carbide.

Figure 18:
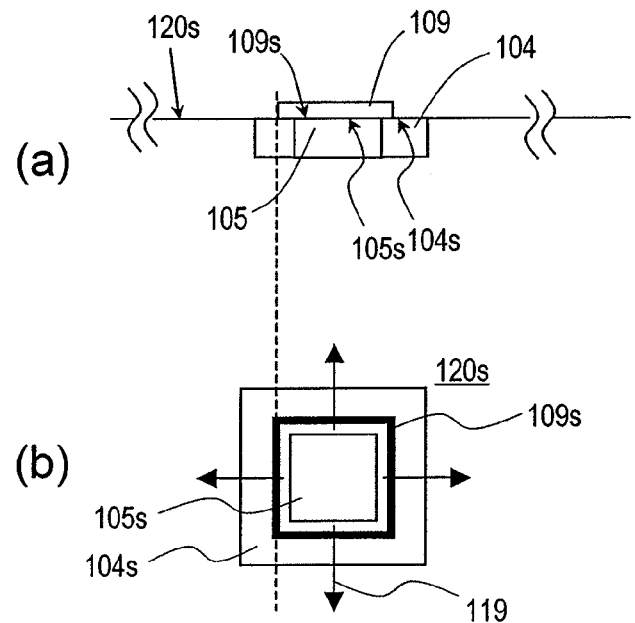

Portion (a) of FIG. 18 is a schematic cross-sectional view illustrating the source electrode 109, the contact region 105 and the source region 104 of the unit cell 1000 and portion (b) of FIG. 18 is a plan view illustrating the contact region's surface 105s, the source region's surface 104s and the conductive surface 109s of the source electrode 109.

Figure 19:
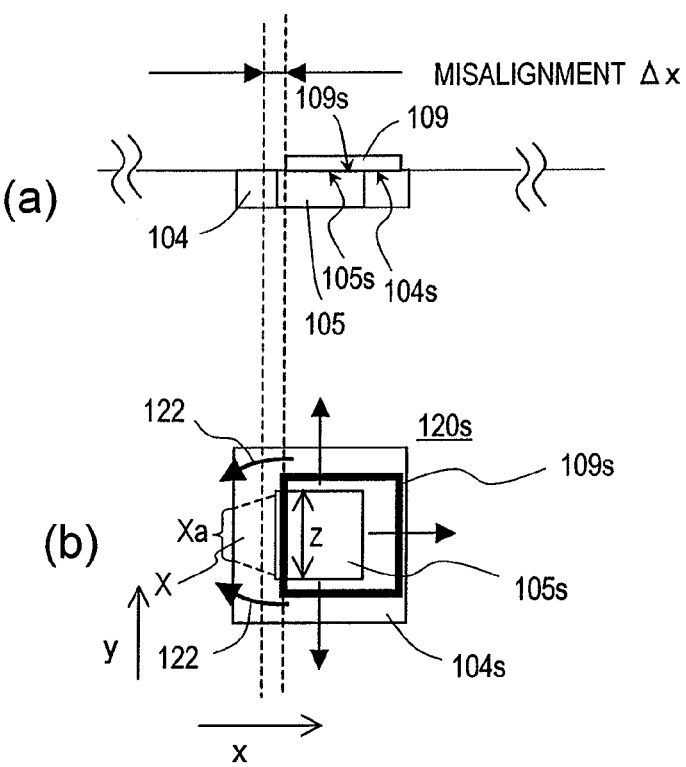

Portions (a) and (b) of FIG. 19 are respectively a cross-sectional view and a top view illustrating the conductive surface 109s of the source electrode 109, the source region's surface 104s and the contact region's surface 105s in a situation where the source electrode 109 has been misaligned.

DESCRIPTION OF REFERENCE NUMERALS 11 substrate
10 semiconductor layer
10s surface of semiconductor layer
12 n-type drift region
13 p-type well region
14 n-type source region
14s n-type source region's surface
15 p$^+$-type contact region
15s p$^+$-type contact region's surface
16 channel layer
17 gate insulating film
18 gate electrode
19 source electrode
19s conductive surface
21 drift electrode
22 interlevel dielectric film
23 upper interconnect electrode
100, 200 unit cell

BEST MODE FOR CARRYING OUT THE INVENTION

A semiconductor device such as a vertical MOSFET includes a semiconductor layer, at least two semiconductor regions of mutually different conductivity types (i.e., an n-type semiconductor region and a p-type semiconductor region) that are defined on the surface of the semiconductor layer, and a conductor that makes ohmic contact with those semiconductor regions. In fabricating such a semiconductor device, if the conductor is formed by a known photolithographic process, then the conductor may be misaligned with the n- and p-type semiconductor regions, thus possibly causing an increase in ON-state resistance and other deteriorations in the performance of the device as described above.

To overcome such a problem, paying attention to the shape of the conductor's surface to contact with the n- and p-type semiconductor regions (i.e., the conductive surface) and those of the n- and p-type semiconductor regions on the surface of the semiconductor layer, the present inventors attempted to find a modified arrangement for a semiconductor device that is specially designed so as to cause substantially no deterioration in device performance even if any misalignment occurred. As a result, the present inventors reached the following conclusion.

Look at portion (b) of FIG. 19 again. The area of the zone X on the source region's surface 104s, where substantially no electrons flow, depends on the length Z of a portion of the profile of the conductive surface 109s that crosses the p$^+$-type contact region 105s. That is to say, the greater the length Z, the larger the area of the zone X on the source region's surface 104s where no electrons flow. As a result, no electrons will flow anymore through an end portion of the source region's surface 104s (where Xa>0), thus significantly affecting the effective gate width. That is why even if misalignment occurred but if the length Z could be reduced significantly, the deterioration in device performance due to the misalignment would be minimized.

The present inventors acquired the basic idea of our invention from this discovery. In a preferred embodiment of the present invention, the conductive surface of the source electrode and the surface of the contact region are shaped such that as the degree of misalignment between the conductive surface and the contact region increases, a portion of the profile of the conductive surface that crosses the contact region has smoothly changing lengths Z.

By adopting such an arrangement, even if misalignment has occurred, the length Z can be much shorter than the conventional one with a sufficient area of contact secured between the conductive surface and the source region and between the conductive surface and the contact region as will be described in detail later. As a result, acceptable device performance can always be guaranteed.

In this case, the degree of actual misalignment between the conductive surface and the contact region is equal to or smaller than one-third of the width of the conductive surface. That is why the effect described above can be achieved if the length Z changes smoothly as the degree of misalignment increases from zero through one-third of the width of the conductive surface.

As used herein, if "the length Z changes smoothly", it means that a function Z (Δx, Δy) that uses Δx and Δy as respective parameters changes continuously with the degrees Δx and Δy of misalignment, where Δx represents the degree of misalignment in the x direction between the conductive surface and the contact region and Δy represents the degree of misalignment in the y direction that intersects with the x direction at right angles. That is to say, the length Z may change in any pattern unless the function Z (Δx, Δy) changes discontinuously with the variations in the degrees of misalignment. That is why the length Z may not only increase or decrease linearly (i.e., at a constant rate) or curvilinearly with the degrees of misalignment but also remain unchanged in a certain range with the degrees of misalignment. Or the length Z may once increase with the degrees of misalignment and then remain constant, or even start decreasing (i.e., monotonic increase or monotonic decrease), at a certain point. If the conductive surface is either square or rectangular, the two directions parallel to its two sides that intersect with each other at right angles are defined as x and y directions and the degrees of misalignment in those two directions are identified by Δx and Δy, respectively.

It should be noted that if the ratio of the area of the contact region to that of the conductive surface is so small that the length Z remains zero even if the degree of misalignment increases from zero to reach one-third of the width of the conductive surface, then the deterioration in device performance due to the misalignment can be avoided. In that case, however, a sufficient area of contact cannot be secured between the contact region and the source electrode, irrespective of the degree of misalignment. That is why the contact resistance between the contact region and the source electrode cannot be reduced and the bipolar transistor can be turned ON easily, thus possibly damaging the device. For that reason, if the contact region is arranged around the center of the conductive surface, the area of the contact region should be at least one-ninth of that of the conductive surface. Also, the length Z when the degree of misalignment is one-third of the width of the conductive surface is preferably greater than the length Z when the degree of misalignment is zero.

The semiconductor device of the present invention has only to be designed such that the conductive surface of the source electrode and the surface of the contact region have such shapes. That is to say, misalignment may occur between the conductive surface and the contact region during the manufacturing process. It should be noted that the "semiconductor device" of the present invention does not have to be a vertical MOSFET but could be any other device with a semiconductor layer.

(EMBODIMENT 1)

Hereinafter, a First Specific Preferred Embodiment of a semiconductor device according to the present invention will be described with reference to the accompanying drawings. The semiconductor device of this preferred embodiment is a vertical MOSFET that uses silicon carbide.

The semiconductor device of this preferred embodiment includes at least one unit cell including a semiconductor layer, source and drain electrodes that are electrically connected to the semiconductor layer, and a gate electrode for use to switch the semiconductor device between ON and OFF states, and typically has a structure in which a number of such unit cells are arranged. In the following description, a semiconductor device consisting of a plurality of unit cells with a substantially quadrangular planar shape will be taken as an example.

FIGS. 1(a) and 1(b) are respectively a schematic cross-sectional view illustrating a unit cell of this preferred embodiment and a plan view illustrating an arrangement of the unit cells.

The unit cell 100 shown in FIG. 1(a) includes a substrate 11, a semiconductor layer 10 that has been formed on the surface of the substrate 11, a source electrode 19 that is electrically connected to the semiconductor layer 10, a gate electrode 18 that covers at least a portion of the semiconductor layer 10, and a drain electrode 21 that is electrically connected to the back surface of the substrate 11. A channel layer 16 and a gate insulating film 17 have been stacked in this order between the semiconductor layer 10 and the gate electrode 18.

The substrate 11 is an n-type semiconductor substrate of silicon carbide such as 4H-SiC, and may be an off-axis substrate, of which the surface has its step density increased by defining a tilt angle (i.e., an off-axis angle) of several degrees with respect to (0001) Si faces.

The semiconductor layer 10 may be a silicon carbide epitaxial layer that has been formed on the substrate 11. The semiconductor layer 10 has a p-type well region 13, which has been defined so as to be electrically isolated from the adjacent unit cell, and an n-type drift region 12, which is the rest of the semiconductor layer 10 other than the p-type well region 13. Inside the p-type well region 13, defined are an n-type heavily doped source region 14 including an n-type dopant and a $p^+$-type contact region 15 that is electrically connected to the p-type well region 13 and that includes a p-type dopant at a higher concentration than the p-type well region 13.

The channel layer 16 is an n-type epitaxial layer of 4H-SiC, for example, and is arranged so as to connect adjacent p-type well region 13 together and to be adjacent to the n-type source region 14.

The source electrode 19 has a conductive surface 19s that makes electrical contact with both the n-type source region 14 and the $p^+$-type contact region 15 and makes ohmic contact with these regions 14 and 15. The source electrodes 14 of the respective unit cells are connected in parallel to each other by an upper interconnect electrode 23. Also, the upper interconnect electrode 23 is electrically isolated from the gate electrode 18 by an interlevel dielectric film 22.

As shown in FIG. 1(b), the respective unit cells 100 are arranged two-dimensionally, and are provided with additional interconnect pads or a terminal structure, if necessary, thereby forming a vertical MOSFET.

In this preferred embodiment, the source electrode 19, the n-type source region 14 and the $p^+$-type contact region 15 are designed so as to have the shapes to be described below.

FIGS. 2(a) and 2(b) illustrate the arrangement of the source electrode 19, the $p^+$-type contact region 15 and the n-type source region 14. Specifically, FIG. 2(a) is a schematic cross-sectional view as viewed on the planes II-II' shown in FIGS. 2(b) and 2(c). FIG. 2(b) is a plan view illustrating a source region's surface 14s, a contact region's surface 15s and the conductive surface 19s of the source electrode 19 arranged on the surface 10s of the semiconductor layer. And FIG. 2(c) is a plan view illustrating the source region's surface 14s and the contact region's surface 15s.

In this preferred embodiment, on the surface 10s of the semiconductor layer, the $p^+$-type contact region's surface 15s has a square shape (each side of which may have a length of 2.1 μm, for example) and is surrounded with the n-type source region's surface 14s with a quadrangular profile (each side of which may have a length of 5.6 μm, for example). The $p^+$-type contact region's surface 15s is arranged such that no side of the $p^+$-type contact region's surface 15s is parallel to the profile of the n-type source region's surface 14s. Meanwhile, the conductive surface 19s of the source electrode 19 has a square shape (each side of which may have a length of 3 μm, for example and) which is bigger than the contact region's surface 15s, and is arranged so as to cover the contact region's surface 15s. In this example, the conductive surface 19s is arranged such that each side of the conductive surface 19s is parallel to its associated side of the n-type source region's surface 14s and overlaps with its associated vertex of the $p^+$-type contact region 15. In the example illustrated in FIG. 2, the n-type source region's surface 14s, the conductive surface 19s and the $p^+$-type contact region's surface 15s are all square. However, the n-type source region's surface 14s, the conductive surface 19s and the $p^+$-type contact region's surface 15s may have any other quadrangular shape(s). For example, the n-type source region's surface 14s and the conductive surface 19s may be rectangular and the $p^+$-type contact region's surface 15s may be rhombic.

In this preferred embodiment, the source electrode 19, the n-type source region 14 and the $p^+$-type contact region 15 are designed as described above. That is why even if the source electrode 19 has been misaligned with the $p^+$-type contact region 15, device performance at an acceptable level can still be realized. The reasons will be described in detail below with reference to the accompanying drawings.

Portions (a) and (b) of FIG. 3 illustrate an ideal situation where the conductive surface 19s of the source electrode 19 has been arranged just as designed on the surface 10s of the semiconductor layer. On the other hand, portions (a) and (b) of FIG. 4 illustrate a situation where the conductive surface 19s of the source electrode 19 has been misaligned by Δx to the right from its designed position. Specifically, respective portions (a) of FIGS. 3 and 4 are schematic cross-sectional views illustrating a portion of the unit cell 100, while respective portions (b) of FIGS. 3 and 4 are plan views illustrating the surface 10s of the semiconductor layer.

In the ideal situation shown in portions (a) and (b) of FIG. 3, during the ON state, electrons flow from the source electrode 19 through the entire peripheral portion of the n-type source region 14 that is in contact with the conductive surface 19s toward a channel layer (not shown). In this case, as the electrons flow over the n-type source region's surface 14s, the gate width does not decrease effectively.

On the other hand, if the conductive surface 19s has been misaligned by Δx to the right (i.e., in the x direction) from its designed position, then an area Y where no electrons flow from the source electrode 19 is produced in a portion of the n-type source region's surface 14s that is located on the left-hand side of the $p^+$-type contact region's surface 15s as shown in portions (a) and (b) of FIG. 4. The size of that area Y depends on the degree of the misalignment Δx. However, the area Y where no electrons flow can be much smaller than the area X where no electrons flow in the conventional semiconductor device that has already been described with reference to portions (a) and (b) of FIG. 19. For example, if the misalignment has occurred approximately to the degree shown in FIG. 4 (e.g., Δx=0.5 μm), then the area Y where no electrons flow does not reach the left end of the source region's surface 14s, and therefore, electrons can still flow through that left end portion of the source region's surface 14s. Consequently, as the gate width does not decrease effectively, almost the same MOSFET performance as in the ideal situation shown in portions (a) and (b) of FIG. 3 is realized. In this example, the conductive surface 19s is supposed to shift in the x direction. However, the same statement is applicable to even a situation where the conductive surface 19s shifts in the −x direction or in the y or −y direction that intersects with the x direction at right angles.

In FIGS. 1 through 4, the surface 10s of the semiconductor layer is supposed to be flat for the sake of simplicity. Actually, however, a portion of the semiconductor layer's surface 10s that is in contact with the source electrode 19 is lower in level than the rest of the semiconductor layer's surface 10s that is not in contact with the source electrode 19. As described above, the source electrode 19 is formed by depositing a conductive material on the semiconductor layer 10 and then subjecting the material to a high-temperature annealing process. The source electrode 19 obtained by such a method includes a reaction layer that has been formed through a reaction between silicon carbide included in the semiconductor layer 10 and the conductive material that makes the source electrode 19. And the lower surface of that reaction layer, i.e., the conductive surface 19s of the source electrode 19, should be located at a lower level than the semiconductor layer's surface 10s before the reaction layer is formed.

According to this preferred embodiment, the conductive surface 19s of the source electrode 19 and the p$^+$-type contact region's surface 15s may be shaped such that as the degree of misalignment Δx between the conductive surface 19s and the p$^+$-type contact region's surface 15s increases, a portion of the profile of the conductive surface 19s that crosses the p$^+$-type contact region 15 has smoothly changing lengths Z. As long as this condition is satisfied, the present invention is never limited to the illustrated arrangement. As described above, the greater the length Z, the bigger the area Y where no electrons flow. As a result, the end of the source region's surface 14s comes to have a portion where no electrons flow. However, if the conductive surface 19s and the contact region 15 are designed as described above, the length Z can be relatively small even if any misalignment has occurred. Consequently, it is possible to prevent the area Y where no electrons flow from decreasing the effective gate width.

Hereinafter, it will be described why the length Z can be relatively small even if any misalignment has occurred.

FIGS. 5(a) through 5(c) are plan views illustrating how the arrangement of the conductive surface 19s and the P$^+$-type contact region's surface 15s changes in the semiconductor device of this preferred embodiment as the degrees of misalignment Δx are varied.

On the other hand, FIGS. 6(a) through 6(c) are plan views illustrating how the arrangement of the conductive surface 109s and the contact region's surface 105s changes in the conventional semiconductor device that has already been described with reference to FIGS. 17 through 19 as the degrees of misalignment Δx are varied. In the conventional semiconductor device shown in FIGS. 6(a) through 6(c), the shapes of the conductive surface 109s and the contact region's surface 105s are supposed to be the same as those of the conductive surface 19s and the contact region's surface 15s of this preferred embodiment. More specifically, each side of the conductive surface 109s is supposed to have a length of 3 μm and each side of the contact region's surface 105s is supposed to have a length of 2.1 p m. Also, FIG. 7(a) is a graph showing how that portion of the profile of the conductive surface 19s that crosses the p$^+$-type contact region's surface 15s changes its lengths Z with the degree of misalignment Δx or Δy in the semiconductor device of this preferred embodiment. On the other hand, FIG. 7(b) is a graph showing how that portion of the profile of the conductive surface 109s that crosses the p$^+$-type contact region's surface 105s changes its lengths Z with the degree of misalignment Δx or Δy in the conventional semiconductor device.

In this preferred embodiment, as the degree of misalignment Δx between the conductive surface 19s and the p$^+$-type contact region's surface 15s increases from zero, the length Z of that portion of the profile of the conductive surface 19s that crosses the p$^+$-type contact region's surface 15s also increases from zero as shown in FIGS. 5(a) through 5(c).

The relation between Δx and the length Z can be represented by the line 72 shown in FIG. 7(a). It can be seen from FIG. 7(a) that the length Z changes smoothly at a constant rate with respect to the degree of misalignment Δx. Also, the gradient (ΔZ/Δx) of the line 72 is two, which shows that the length Z changes gently. In this graph, the degree of misalignment Δx is supposed to increase to reach 1.5 μm (which is a half of the width of the conductive surface 19s). Actually, however, the degree of misalignment Δx is smaller than 1.5 μm, e.g., 1 μm (that is one-third of the width of the conductive surface 19s) or less, and preferably 0.5 μm or less. In this example, the conductive surface 19s is supposed to shift in the x direction with respect to the p$^+$-type contact region's surface 15s. However, even if the conductive surface 19s shifts in the y direction that intersects with the x direction at right angles, the relation between the degree of misalignment Δy and the length Z can also be represented by a line similar to this one 72.

On the other hand, in the conventional semiconductor device, it is not until the degree of misalignment Δx between the conductive surface 109s and the contact region's surface 105s being increased from zero reaches 0.45 μm that the profile of the conductive surface 109s overlaps with the contact region's surface 105s for the first time as shown in FIGS. 6(a) through 6(c). That is to say, the length Z of that portion of the conductive surface 109s that crosses the contact region's surface 105s remains zero until Δx=0.45 μm. Once Δx reaches 0.45 μm, however, the length Z changes discontinuously to get equal to the length of one side of the contact region's surface 105s (i.e., Z=2.1 μm). Thereafter, even if the degree of misalignment A x is increased to 1.5 μm (i.e., a half of the width of the conductive surface 19s), the length Z still remains 2.1 μm. The relation between the degree of misalignment Δx and the length Z can be represented by the line 76 shown in FIG. 7(b). Even if the conductive surface 109s shifts in the y direction with respect to the p$^+$-type contact region's surface 105s, the relation between the degree of misalignment Δy and the length Z can also be represented by a line similar to this one 76.

As can be seen from FIGS. 7(a) and 7(b), if the degree of misalignment Δx or Δy is less than 0.45 μm, the length Z in the conventional semiconductor device is zero, which is smaller than the length Z in the semiconductor device of this preferred embodiment. However, if the degree of misalignment is that small in the semiconductor device of this preferred embodiment, the length Z is much smaller than the width of the conductive surface 19s (e.g., one-third or less of the width of the conductive surface 19s), and the electrons reach even the portion of the n-type source region 14 that is located on the left-hand side of the conductive surface 19s. That is to say, since the area Y where no electrons flow does not reach the left end of the source region's surface 14s, the effective gate width does not decrease. Consequently, as long as the degree of misalignment Δx or Δy is less than 0.45 μm, both the semiconductor device of this preferred embodiment and the conventional semiconductor device achieve MOSFET performance that is comparable to an ideal situation where there is no misalignment.

On the other hand, if the degree of misalignment Δx or Δy is equal to or greater than 0.45 μm, the length Z in the semiconductor device of this preferred embodiment is equal to or smaller than 2.1 μm, which is the length Z in the conventional semiconductor device. Thus, it can be seen that the influence of the area Y where no electrons flow on the effective gate width can be reduced compared to the conventional arrangement.

It should be noted that if the degree of misalignment Δx or Δy exceeds 1.05 μm, the length Z in the semiconductor device of this preferred embodiment exceeds 2.1 μm. However, as the degree of misalignment in an actual photolithographic process is normally 1.0 μm or less, preferably 0.5 μm or less, there is no problem even if the length Z is large in such a range.

The degree of misalignment Δx or Δy to be caused in an actual photolithographic process is determined by not just the precision of an exposure system for use in the photolithographic process but also other factors as well. Examples of those other factors include the warp of the semiconductor substrate, patterning errors that could occur in an etching or epitaxy process, and expansion, shrinkage or critical dimension shift of the substrate, film, mask and so on. If multiple factors were involved at the same time, the degree of misalignment could be greater than the expected one (e.g., could be 0.5 μm or more). Even so, as long as the degree of misalignment is a half or less (more preferably one-third or less) of the width of the conductive surface, the ON-state resistance can still be reduced by applying the present invention.

For example, due to a critical dimension shift that has been caused by some system jam or the deviation of a patterning condition, the conductive surface 19s or 109s may have a smaller size than the designed one. In that case, the ratio in the area of the contact region's surface 15s or 105s to the conductive surface 19s or 109s will increase. And even if the degree of misalignment Δx or Δy is small, the conductive surface 19s or 109s is likely to overlap with the contact region's surface 15s or 105s. As a result, significant effects can be achieved by applying the present invention.

FIG. 8 is a cumulative frequency distribution of the ON-state resistances of MOS transistors that were actually fabricated by applying this preferred embodiment. For the purpose of comparison, the ON-state resistances of MOS transistors having the structure shown in FIG. 6(a) are also shown in FIG. 8. As can be seen from FIG. 8, the ON-state resistances of MOS transistors having the structure of this preferred embodiment had a median of approximately 6.0 mΩcm², whereas those of the conventional MOS transistors had a median of approximately 6.2 mΩcm². That is to say, there was a difference of approximately 0.2 mΩcm² between those two types. Thus, the present inventors confirmed that the increase in ON-state resistance could be reduced by approximately 0.2 mΩcm² by applying this preferred embodiment.

It should be noted that the shapes of the conductive surface 19s and the p$^+$-type contact region's surface 15s that satisfy the relation between the degree of misalignment Δx or Δy and the length Z of this preferred embodiment are not limited to the ones shown in FIGS. 5(a) through 5(c). FIGS. 9(a) through 9(h) are plan views illustrating other exemplary shapes for the conductive surface 19s of the source electrode 19, the source region's surface 14s and the p$^+$-type contact region's surface 15s. In each of these examples, the shape of the source region's surface 14s is supposed to be quadrangular (e.g., square). However, the source region's surface 14s does not have to be quadrangular. Also, even if any of the designs shown in FIG. 9(a) through 9(h) is adopted, the arrangement of the conductive surface 19s with respect to the p$^+$-type contact region's surface 15s could deviate in an actual semiconductor device to a certain degree from the illustrated one due to a misalignment that will occur almost inevitably in a manufacturing process. However, those slightly shifted arrangements are also supposed to fall within the scope of the present invention.

Specifically, in the example illustrated in FIG. 9(a), the conductive surface 19s is either square or rectangular, while the p$^+$-type contact region's surface 15s has a quadrangular shape (e.g., square) that is arranged such that each vertex portion thereof projects out of its associated side of the conductive surface 19s. On the other hand, in the example illustrated in FIG. 9(b), the conductive surface 19s is either square or rectangular, while the p$^+$-type contact region's surface 15s has a quadrangular shape (e.g., rectangular) that is arranged such that each vertex thereof overlaps with its associated side of the conductive surface 19s. Furthermore, in the example illustrated in FIG. 9(c), the conductive surface 19s is either square or rectangular, while the p$^+$-type contact region's surface 15s has a quadrangular shape that is arranged inside the conductive surface 19s such that no sides of the p$^+$-type contact region 15 are parallel to any side of the conductive surface 19s.

In the examples illustrated in FIGS. 9(a) through 9(c), each of the conductive surfaces 19s and the p$^+$-type contact regions 15s is supposed to be either square or rectangular. But the conductive surface 19s and the p$^+$-type contact regions 15s may also have any other quadrangular shape or may even have a non-quadrangular polygonal shape. For example, a triangular p$^+$-type contact region 15s or a hexagonal p$^+$-type contact region 15s such as the one shown in FIG. 9(h) may also be provided. Also, in a situation where the conductive surface 19s and the p$^+$-type contact region's surface 15s have polygonal (preferably quadrangular) shapes, the p$^+$-type contact region 15 and the conductive surface 19s are preferably arranged such that each side of the p$^+$-type contact region's surface 15s is not parallel to an adjacent side of the conductive surface 19s. In that case, as the degree of misalignment Δx or Δy increases, that portion of the profile of the conductive surface 19s that crosses the p$^+$-type contact region 15s can have smoothly changing lengths Z. The angle defined by each side of the p$^+$-type contact region's surface 15s with respect to its associated side of the conductive surface 19s is preferably 30 degrees through 60 degrees, more preferably 40 degrees through 50 degrees. In this manner, if the conductive surface 19s has any side that defines an angle of 30 degrees to 60 degrees with respect to its associated side of the contact region's surface 15s, the dimensions of the area Y where no electrons flow to be caused in the n-type source region 14 due to misalignment can be reduced more effectively.

The p$^+$-type contact region's surface 15s and the conductive surface 19s are preferably shaped such that each vertex of the p$^+$-type contact region's surface 15s overlaps with its associated side of the conductive surface 19s as in the examples illustrated in FIGS. 9(b) and 9(d). That is to say, the p⁺-type contact region's surface 15s and the conductive surface 19s may be formed in any shapes as long as each vertex of the p⁺-type contact region's surface 15s can overlap with its associated side of the conductive surface 19s. In other words, actually those sides may not overlap with each other due to a mask misalignment, for example. If the p⁺-type contact region's surface 15s and the conductive surface 19s have such shapes, the contact resistance between the source electrode 19 and the p⁺-type contact region 15 can be reduced by securing a sufficient area of contact between them and the increase in ON-state resistance due to their misalignment can be minimized.

Also, the same effects can also be achieved even if the p⁺-type contact region 15 is arranged such that each side of the p⁺-type contact region's surface 15s becomes parallel to its associated side of the source region's surface 14s and if the conductive surface 19s is arranged such that each side of the conductive surface 19s defines an angle of 45 degrees with its associated sides of the p⁺-type contact region's surface 15s as shown in FIG. 9(d).

The conductive surface 19s of the source electrode 19 and the p⁺-type contact region's surface 15s may also have a circular or elliptical shape. For example, as shown in FIG. 9(e), the p⁺-type contact region's surface 15s may have the shape of a circle that is inscribed in the conductive surface 19s in a quadrangular shape. Alternatively, as shown in FIGS. 9(f) and 9(g), the conductive surface 19s may be circular and the p⁺-type contact region's surface 15s may have the shape of a quadrangle or an ellipse that is inscribed in that circle. If the p⁺-type contact region's surface 15s has such a shape that is inscribed in the conductive surface 19s, the increase in ON-state resistance that would be caused by misalignment can be reduced with a sufficient area of contact secured between the p⁺-type contact region 15 and the conductive surface 19s. It should be noted that the p⁺-type contact region's surface 15s does not have to have such a shape as being inscribed in the conductive surface 19s.

Nevertheless, the conductive surface 19s and the p⁺-type contact region 15s need to be designed such that at least one of them is not circular. This is because if the conductive surface 19s and the p⁺-type contact region 15s were both circular, then the respective profiles of the p⁺-type contact region 15s and the conductive surface 19s would be quasi-parallel to each other. As a result, the variation ΔZ in length Z with the degree of misalignment Δx or Δy would increase. That is to say, the gradient of a graph (Δz/Δx, ΔZ/Δy), of which the abscissa is Δx, Δy and the ordinate is the length Z, would increase. As a result, the increase or variation in ON-state resistance due to the misalignment could not be reduced significantly and the effects of the present invention could not be achieved.

Furthermore, the conductive surface 19s and the p⁺-type contact region 15 preferably do not have such shapes that would agree with each other by a combination of a translation and a magnification or shrinkage around the origin. For example, if the conductive surface 19s and the p⁺-type contact region 15 had the shapes of analogous ellipses or triangles and were arranged so as to agree with each other by a combination of a translation and a magnification or shrinkage without rotation, the length Z would also change smoothly with the increase in the degree of misalignment Δx or Δy. However, the variation ΔZ in the length Z with the degree of misalignment Δx, Δy would increase too much to reduce the ON-state resistance sufficiently. In contrast, even if the conductive surface 19s and the p⁺-type contact region's surface 15s are both square and analogous to each other but are arranged so as not to agree with each other by a combination of a translation and a magnification or shrinkage around the origin as shown in FIG. 2(b), the variation ΔZ in the length Z with Δx, Δy (i.e., the gradient of the line 72 shown in FIG. 7(a)) can be reduced significantly. As a result, the increase and variation in ON-state resistance due to the misalignment can be minimized effectively.

If the p⁺-type contact region 15 and the source electrode 19 are formed by a photolithographic process, for example, the p⁺-type contact region's surface 15s and the conductive surface 19s of the source electrode 19 may have shapes that are not just as designed as being affected by the resolution of the photolithographic process. More specifically, even if those shapes are designed to be quadrangular, the actual shapes could have rounded corners. Even so, as long as the p⁺-type contact region's surface 15s and the conductive surface 19s are designed so as to satisfy the relation between the degree of misalignment Δx, Δy and the length Z according to the present invention, the deterioration in device performance due to the misalignment can also be minimized. Thus, such a situation also falls within the scope of the present invention.

Furthermore, the p⁺-type contact region's surface 15s and the conductive surface 19s of the source electrode 19 just need to satisfy the relation between the degree of misalignment and the length Z described above if the misalignment has occurred in a particular direction. And the length Z does not have to change continuously with respect to the misalignment in every direction. Furthermore, in this preferred embodiment, the degrees of misalignment in multiple directions (including Δx and Δy) and the length Z preferably satisfy the relation described above. In that case, the increase in ON-state resistance due to the misalignment can be minimized irrespective of the direction of misalignment.

In the example shown in FIG. 7(a), the length Z is supposed to increase linearly with the degree of misalignment Δx, Δy. However, the degree of misalignment Δx, Δy and the length Z do not have to have the relation shown in FIG. 7(a). For example, if the semiconductor device has the conductive surface 19s and the p⁺-type contact region's surface 15s such as the ones shown in FIG. 9(a), then the degree of misalignment Δx, Δy and the length Z have the relation represented by the line B1 shown in FIG. 10. On the other hand, if the semiconductor device has the conductive surface 19s and the p⁺-type contact region's surface 15s such as the ones shown in FIG. 9(c), then the length Z is zero when the degree of misalignment Δx, Δy is equal to or smaller than a predetermined value but starts to increase when the degree of misalignment Δx, Δy exceeds the predetermined value as represented by the line B2 shown in FIG. 10. The gradients (ΔZ/Δx, ΔZ/Δy) of the line B1 and that portion of the line B2 in which the length Z increases are both equal to two. Thus, it can be seen that the length Z increases gently as the degree of misalignment Δx, Δy increases.

Also, if the semiconductor device has the conductive surface 19s and the p⁺-type contact region's surface 15s such as the ones shown in FIG. 9(e), then the length Z increases curvilinearly with the degree of misalignment Δx, Δy as represented by the curve B3 shown in FIG. 10. In that case, the gradient (ΔZ/Δx, ΔZ/Δy) of the graph changes with the degree of misalignment Δx, Δy. More specifically, the closer to zero the degree of misalignment is, the steeper the gradient gets. And as the degree of misalignment increases, the gradient becomes gradually gentler. Furthermore, if an equilateral hexagonal p⁺-type contact region's surface 15s is arranged inside a square conductive surface 19s as shown in FIG. 9(h), then the length Z increases linearly with the degree of misalignment Δx and then becomes constant as represented by the line B4 shown in FIG. 10. The portion of the line B4 in which the length Z increases linearly has a gradient ΔZ/Δx of 2√3 (approximately 3.46). Thus, the length Z increases gently. In this manner, the relation between the length Z and the degree of misalignment Δx, Δy may be represented by any of various graphs according to the shapes and arrangement of the conductive surface 19s and the contact region 15s.

The gradients (ΔZ/Δx, ΔZ/Δy) of the graphs are not particularly limited. However, at least one of ΔZ/Δx and ΔZ/Δy is preferably equal to or smaller than four. Then, the deterioration in device performance can be reduced even more effectively. Among the various shapes for the conductive surface 19s and the p$^+$-type contact region's surface 15s shown in FIG. 9, if the conductive surface 19s has a side that defines an angle of 30 degrees with respect to an adjacent side of the contact region's surface 15s as in the example shown in FIG. 9(h), then ΔZ/Δx becomes 2√3, which is less than four. Also, in the example illustrated in FIG. 9(c), ΔZ/Δx and ΔZ/Δy are both equal to two as represented by the line B2 shown in FIG. 10. If both of the gradients ΔZ/Δx and ΔZ/Δy are equal to or smaller than four in this manner, the influence of misalignment in the two directions that intersect with each other at right angles can be reduced effectively, which is beneficial.

The semiconductor device of this preferred embodiment may be fabricated by the following method, for example.

Figure 11:
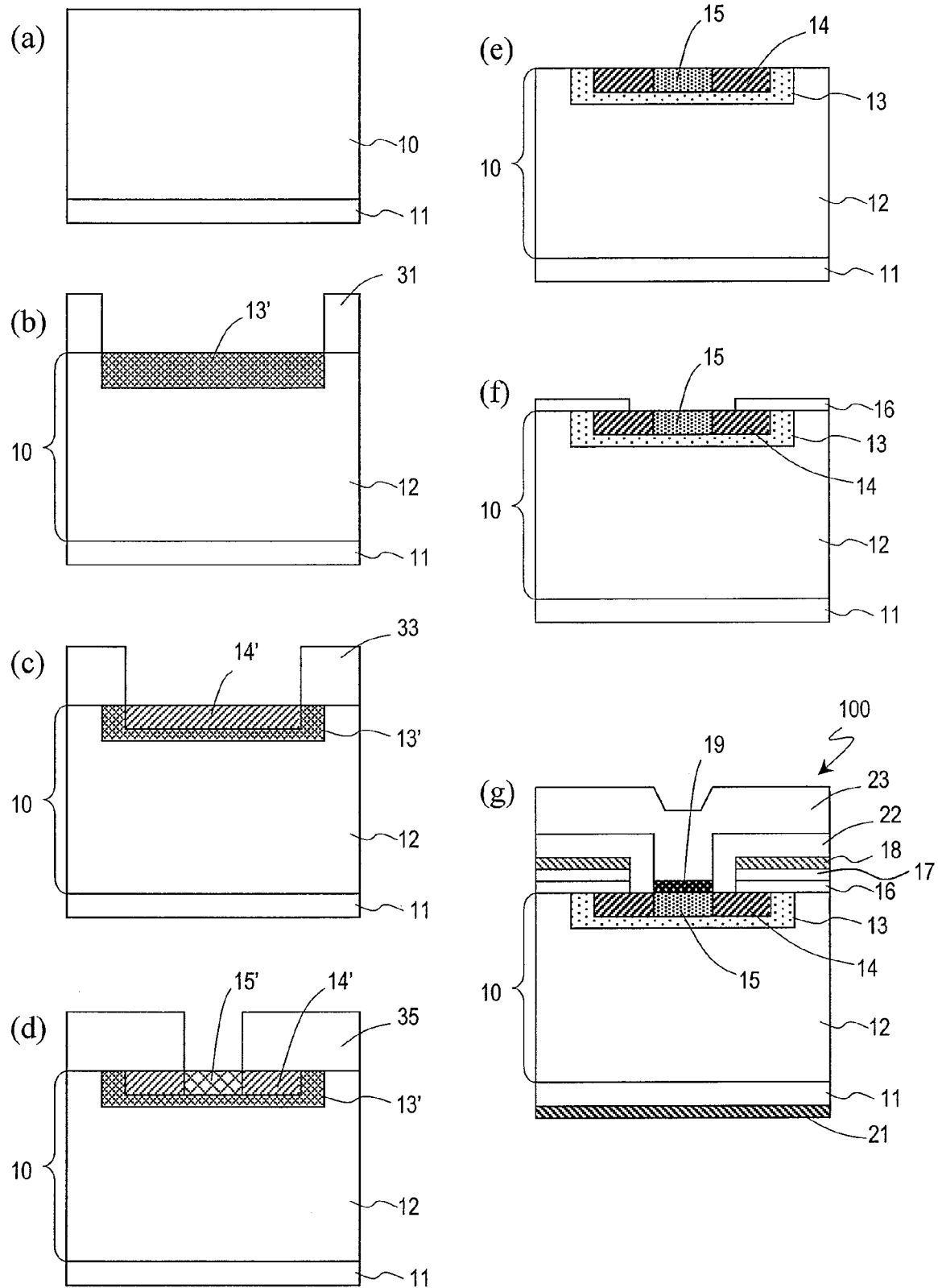

First, as shown in FIG. 11(a), a silicon carbide layer is formed as a semiconductor layer 10 on a substrate 11 of silicon carbide. As the substrate 11, a 4H-SiC substrate with a diameter of 3 inches, of which the principal surface defines an off-axis angle of eight degrees in [11-20] (one, one, two bar, one) directions from (0001) planes, may be used, for example. The conductivity type of the substrate 11 is n-type and the carrier density thereof is $1 \times 10^{18}$ cm$^{-3}$. The semiconductor layer may be formed by a CVD process using an annealing furnace. In this preferred embodiment, a silicon carbide layer doped with an n-type dopant is grown epitaxially on the principal surface of the substrate 11. The thickness of the semiconductor layer 10 changes with the specification the semiconductor device should satisfy but is typically adjusted within the range of 5 μm to 100 μm. Also, the dopant concentration of the semiconductor layer 10 is appropriately controlled within the range of $1 \times 10^{14}$ cm$^{-3}$ to $1 \times 10^{17}$ cm$^{-3}$. Optionally, a buffer layer made of n-type silicon carbide may be inserted between the substrate 11 and the semiconductor layer 10.

Next, as shown in FIG. 11(b), a first dopant ion implanted layer 13' (with a thickness of 1.5 μm to 2 μm, for example) is formed in a selected portion of the semiconductor layer 10. Specifically, first, a mask layer 31 of silicon dioxide (SiO$_2$), for example, is formed on the surface of the semiconductor layer 10. The mask layer 31 has an opening that defines the portion of the semiconductor layer 10 that will be the first dopant ion implanted layer 13'. The mask layer 31 may be formed in an arbitrary pattern by photolithographic and etching processes. In this example, the shape of the opening of the mask layer 31 is designed such that the first dopant ion implanted layer 13' will have a square surface shape (with a length of 5.6 μm each side). The thickness of the mask layer 31 is determined by its material and the implantation condition but is preferably much greater than the implantation range. Next, p-type dopant ions (such as Al ions) are implanted into the semiconductor layer 10 from over the mask layer 31. During the ion implantation, the temperature of the substrate may be adjusted within the range of 100° C. to 200° C. or may even be room temperature. When the ion implantation process is over, the mask layer 31 is removed. In this manner, the first dopant ion implanted layer 13' is formed in that portion of the semiconductor layer 10 into which the dopant ions have been implanted. Meanwhile, the rest of the semiconductor layer 10 into which no dopant ions have been implanted becomes an n-type drift region 12.

Subsequently, as shown in FIG. 11(c), a second dopant ion implanted layer 14' (with a thickness of 0.5 μm to 1 μm) is formed in the semiconductor layer 10. Specifically, first, a mask layer 33 with an opening that exposes a portion of the surface of the first dopant ion implanted layer 13' is formed on the semiconductor layer 10. In this example, the shape of the opening of the mask layer 33 is designed such that the second dopant ion implanted layer 14' will have a square surface shape (with a length of 3 μm each side, for example). The mask layer 33 may be made of the same material, and formed by the same process, as the mask layer 31. Next, n-type dopant ions (such as nitrogen ions or phosphorus ions) are implanted into the semiconductor layer 10 from over the mask layer 33. When the ion implantation process is over, the mask layer 33 is removed. In this manner, the second dopant ion implanted layer 14' is formed in the first dopant ion implanted layer 13'.

Furthermore, as shown in FIG. 11(d), a third dopant ion implanted layer 15' is formed in the semiconductor layer 10. Specifically, the third dopant ion implanted layer 15' is formed by defining a mask layer 35 with an opening that exposes a portion of the second dopant ion implanted layer 14' on the semiconductor layer 10 and then implanting p-type dopant ions (such as aluminum ions) into the semiconductor layer 10 from over the mask layer 35. The shape of the opening of the mask layer 35 is designed such that the surface of the third dopant ion implanted layer 15' will have a square shape (with a length of 2.1 μm each side, for example), of which the vertices are located on the respective sides of the square surface of the second dopant ion implanted layer 14'. When the ion implantation process is over, the mask layer 35 is removed.

Subsequently, as shown in FIG. 11(e), the first, second and third dopant ion implanted layers 13', 14' and 15' are annealed at an elevated temperature of 1,500° C. or more and have their dopants activated, thereby defining a p-type well region 13, an n-type source region 14 and a p$^+$-type contact region 15, respectively. The carrier densities of the p-type well region 13 and the n-type source region 14 thus defined are determined by the conditions of the ion implantation process steps described above, and are controlled so as to fall within the range of $1 \times 10^{17}$ cm$^{-3}$ to $1 \times 10^{19}$ cm$^{-3}$ and the range of $1 \times 10^{18}$ cm$^{-3}$ to $1 \times 10^{21}$ cm$^{-3}$, respectively. On the other hand, the carrier density of the p$^+$-type contact region 15 is controlled so as to be higher than that of the p-type well region 13.

Next, as shown in FIG. 11(f), a channel layer 16 of n-type silicon carbide is epitaxially grown on the semiconductor layer 10. The average dopant concentration in the channel layer 16 is controlled so as to fall within the range of $1 \times 10^{15}$ cm$^{-3}$ to $1 \times 10^{13}$ cm$^{-3}$. The channel layer 16 may have either a single layer structure or a multilayer structure.

Thereafter, as shown in FIG. 11(g), a gate insulating film 17, a source electrode 19, a drain electrode 21, a gate electrode 18, an interlevel dielectric film 22 and an upper interconnect electrode 23 are formed, thereby completing a semiconductor device 100 as a vertical MOSFET.

The gate insulating film 17 may be formed by thermally oxidizing the surface of the channel layer 16 of silicon carbide at a temperature of 1,100° C. Alternatively, the gate insulating film 17 may also be formed by depositing a single-layer or multilayer insulating film on the channel layer 16. The thickness of the gate insulating film 17 is controlled within the range of 20 nm to 200 nm. Meanwhile, the gate electrode 18 may be formed by depositing a polysilicon film or a metal film with low resistivity on the gate insulating film 17 and then patterning it.

The source electrode 19 may be formed in the following manner. Specifically, after the gate insulating film 17 and the gate electrode 18 have been formed, an interlevel dielectric film 22 is deposited so as to cover the gate electrode 18. Then, an opening is cut through that interlevel dielectric film 22 to expose a portion of the surface of the semiconductor layer 10. Thereafter, a conductive material such as Ni is deposited at the bottom of the opening and then annealed at a high temperature as described above, thereby forming a source electrode 18. As a result of the annealing process, the conductive material reacts with silicon carbide in the semiconductor layer 10, thereby forming a reaction layer. That is why at least a portion of the source electrode 19 thus obtained is such a reaction layer. And due to the presence of that reaction layer, the source electrode 19 can make good ohmic contact with the $p^+$-type contact region 15 and the n-type source region 14 in the semiconductor layer 10. If the source electrode 19 is formed by such a method, the shape of the conductive surface of the source electrode 19 can be adjusted by that of the opening to cut through the interlevel dielectric film 22.

The upper interconnect electrode 23 is formed so as to fill the opening of the interlevel dielectric film 22 and is electrically connected to the source electrode 19. As the material of the upper interconnect electrode 23, aluminum may be used, for example. The drain electrode 21 may be formed at any point in time during this manufacturing process by depositing a metallic material on the back surface of the substrate 11, for example.

The source electrode 19 does not have to be formed by the method described above. For example, the source electrode 19 may be formed before the interlevel dielectric film 22 is deposited. Specifically, in that case, the source electrode 19 may be formed by depositing a conductor film over the entire semiconductor layer 10, patterning the conductor film into a predetermined shape and then annealing the remaining portion of the conductor film at an elevated temperature of approximately 1,000° C. According to this method, the shape of the conductive surface of the source electrode 19 can be controlled by patterning the conductor film, and therefore, a conductive surface of a very small size or a polygonal (such as quadrangular) conductive surface can be formed with higher precision. Furthermore, if the source electrode 19 is formed by such a method, an interlevel dielectric film 22 is deposited over the entire surface of the substrate after the source electrode 19 has been formed. Then, an opening may be cut through the interlevel dielectric film 22 by a technique such as dry etching so as to expose a portion of the source electrode 19. And the upper interconnect electrode 23 may be formed so as to fill that opening.

Furthermore, according to the method described above, after the first dopant ion implanted layer 13' to be the well region 13 has been formed using the mask layer 31, the second dopant ion implanted layer 14' to be the source region 14 is formed using the mask layer 33 and then the third dopant ion implanted layer 15' to be the $p^+$-type contact region 15 is formed using the mask layer 35. However, the order in which these dopant ion implanted layers 13', 14' and 15' are formed is not particularly limited. For example, after the third dopant ion implanted layer 15' to be the $p^+$-type contact region 15 has been formed, the second dopant ion implanted layer 14' to be the source region 14 may be formed.

Figure 2:
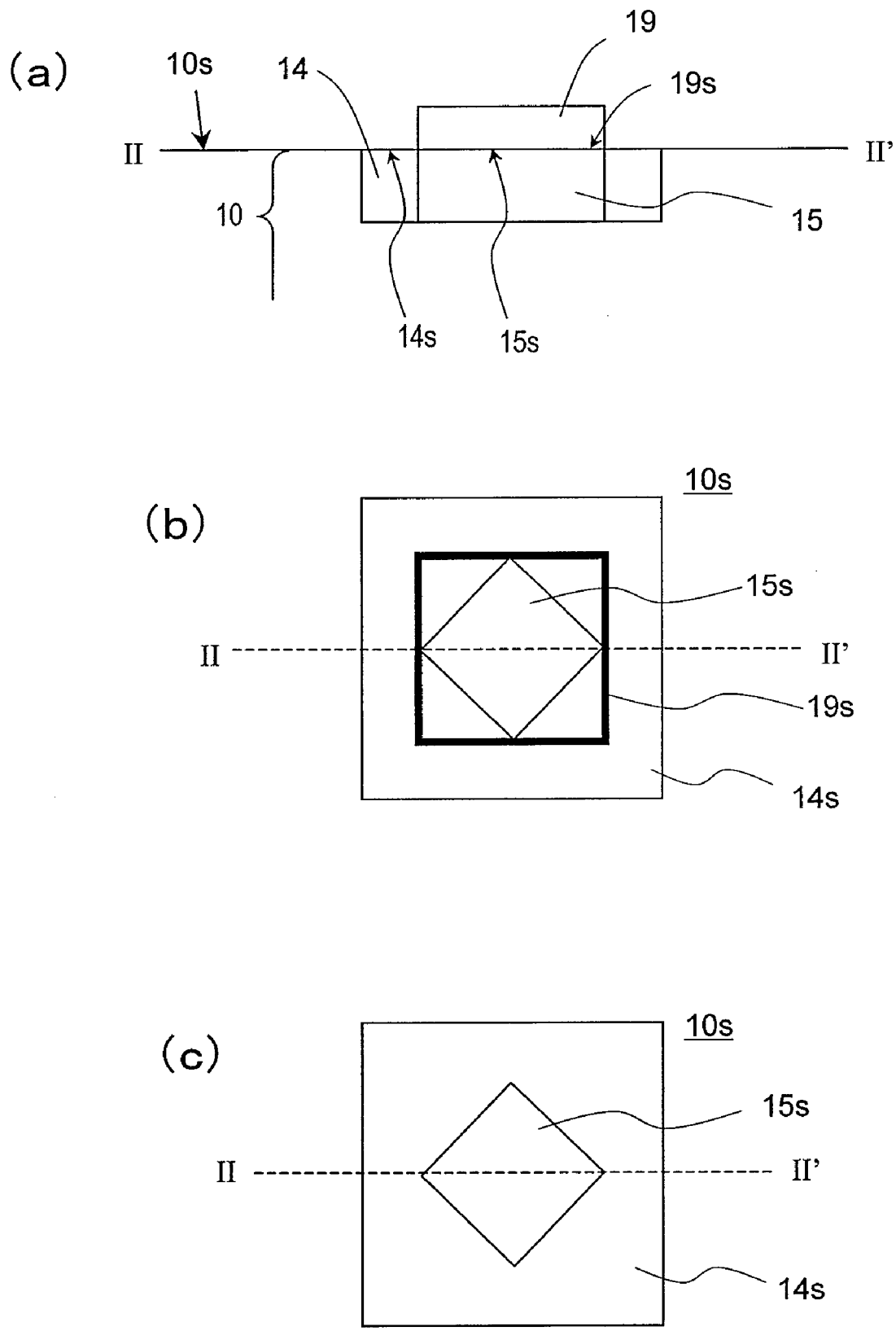
FIG. 2(a) is a schematic cross-sectional view of a source electrode 19, a p$^+$-type contact region 15 and an n-type source region 14 according to the first preferred embodiment.
FIG. 2(b) is a plan view illustrating the conductive surface 19s of the source electrode 19, the p$^+$-type contact region's surface 15s and the n-type source region's surface 14s.
FIG. 2(c) is a plan view illustrating the p$^+$-type contact region's surface 15s and the n-type source region's surface 14s.

It should be noted that the semiconductor device of this preferred embodiment does not have to have the configuration shown in FIGS. 1 and 2. For example, although the channel layer 16 of silicon carbide is arranged on the semiconductor layer 10 in the configuration shown in FIGS. 1 and 2, the channel layer 16 may be omitted as in the semiconductor device shown in FIG. 12. In such a structure with no channel layer 16, a channel can be produced by inverting the conductivity type of the drift region under the gate electrode with a voltage applied to the gate electrode 18.

(EMBODIMENT 2)

Hereinafter, a second preferred embodiment of a semiconductor device according to the present invention will be described with reference to the accompanying drawings. The semiconductor device of this preferred embodiment is a vertical MOSFET that uses silicon carbide but consists of striped unit cells unlike the counterpart shown in FIGS. 1 and 2. In the following description, a comb shaped MOSFET, unit cells of which have stripes that run perpendicularly to the direction in which electrons flow through the channel, will be described as an example.

FIG. 13(*a*) is a schematic cross-sectional view illustrating an exemplary unit cell as a second preferred embodiment of the present invention. FIG. 13(*b*) is a top view illustrating the arrangement of the unit cells in the semiconductor device of this preferred embodiment. For the sake of simplicity, any pair of components shown in both FIGS. 1(*a*) and 1(*b*) and FIGS. 13(*a*) and 13(*b*) and having substantially the same function is identified by the same reference numeral.

The unit cell 200 shown in the cross-sectional view of FIG. 13(*a*) has substantially the same configuration, and operates in almost the same way, as the unit cell 100 shown in FIG. 1(*a*), and the description thereof will be omitted herein. However, the unit cell 200 has stripes that run perpendicularly to the direction in which electrons flow through the channel. The $p^+$-type contact region 15, n-type source region 14, source electrode 19 and other components of the unit cell 200 also have similar striped shapes. Also, such unit cells 200 are arranged as shown in FIG. 13(*b*) and are provided with additional wiring pads or terminal structures, if necessary, thereby forming an MOSFET.

FIG. 14(*a*) is a schematic cross-sectional view of the semiconductor device as viewed on the plane XIV-XIV' shown in FIGS. 14(*b*) and 14(*c*) to illustrate the source electrode 19, the $p^+$-type contact region 15 and the n-type source region 14. FIG. 14(*b*) is a plan view illustrating the conductive surface 19*s* of the source electrode 19, the $p^+$-type contact region's surface 15*s* and the n-type source region's surface 14*s* on the surface 10*s* of the semiconductor layer. Meanwhile, FIG. 14(*c*) is a plan view illustrating the $p^+$-type contact region's surface 15*s* and the n-type source region's surface 14*s* on the surface 10*s* of the semiconductor layer.

In this preferred embodiment, the conductive surface 19*s* of the source electrode 19 has a stripe shape (with a width of 3 μm, for example) that runs perpendicularly to the direction in which electrons flow through the channel as shown in FIG. 14(*b*). On the other hand, the $p^+$-type contact region's surface 15*s* is made up of a number of square portions (with a length of 2.1 μm each side, for example). These square portions are arranged in line such that their diagonals are aligned with the centerline of the conductive surface 19*s*, and are preferably shaped such that two opposing ones of the four vertices thereof overlap with the profile (i.e., the longer sides) of the conductive surface 19*s*. Also, the source region's surface 14*s* is arranged around the $p^+$-type contact region's surface 15*s*. In the plan views shown in FIGS. 14(*b*) and 14(*c*), the shapes of the source region's surface 14*s* and the $p^+$-type contact region's surface 15*s* at the ends of the unit cell are not shown.

However, the p⁺-type contact region's surface 15s may be either surrounded with the source region's surface 14s or just interposed between two striped portions of the source region's surface 14s. In other words, on the surface 10s of the semiconductor layer, the source electrode 14 just needs to be located between the p⁺-type contact region 15 and the well region 13. As used herein, if "the source region's surface 14s is located around the p⁺-type contact region's surface 15s", the p⁺-type contact region's surface 15s may be not just surrounded with the source region's surface 14s but also sandwiched between two striped portions of the source region's surface 14s in a striped MOSFET.

As in the preferred embodiment described above, the conductive surface 19s of the source electrode 19 and the p⁺-type contact region's surface 15s of this preferred embodiment are also shaped such that as the degree of misalignment Δx between the conductive surface 19s and the p⁺-type contact region's surface 15s (i.e., the degree of misalignment in the channel direction) increases, a portion of the profile of the conductive surface 19s that crosses each square portion of the p⁺-type contact region 15 has smoothly changing lengths Z. That is why in a situation where misalignment has occurred between the source electrode 19 and the p⁺-type contact region 15, the length Z can be much smaller than the conventional one, and therefore, the area where no electrons flow at the end of the source region's surface 14s can be reduced significantly. As a result, no matter whether misalignment has occurred or not, an effective gate width and effective gate current can be ensured. In addition, the variation in ON-state resistance due to the misalignment can also be reduced.

Furthermore, in this preferred embodiment, the conductive surface 19s is designed such that one half of its entire area contacts with the p⁺-type contact region's surface 15s and the other half contacts with the source region's surface 14s. As a result, a sufficient area of contact can be ensured both between the source electrode 19 and the p⁺-type contact region's surface 15s and between the source electrode 19 and the source region's surface 14s. Consequently, the damage that would be done on the device by induced current can be reduced with the ON-state resistance reduced significantly.

According to this preferred embodiment, the conductive surface 19s and the contact region 15s do not have to have the shapes shown in FIG. 14. Alternatively, with respect to the single conductive surface 19s, a number of contact regions 15s may be arranged in line perpendicularly to the channel direction so as to be spaced from each other. And some or all of those contact regions 15s may be connected together. Still alternatively, the contact region 15s may include a plurality of main contact portions that are arranged along striped portions of the conductive surface 19s that run perpendicularly to the channel direction. And some or all of those main contact portions may be connected together with connecting portions that have a narrower width than the main contact portions.

FIGS. 15(a) through 15(f) are plan views illustrating other preferred shapes of the source region's surface 14s, the conductive surface 19s of the source electrode 19, and the p⁺-type contact region's surface 15s. Even in these examples, the conductive surface 19s and the p⁺-type contact region's surface 15s are also shaped such that the length Z changes smoothly as the degree of misalignment Δx increases. Consequently, the deterioration in device performance due to the misalignment can be reduced significantly.

Figure 15:
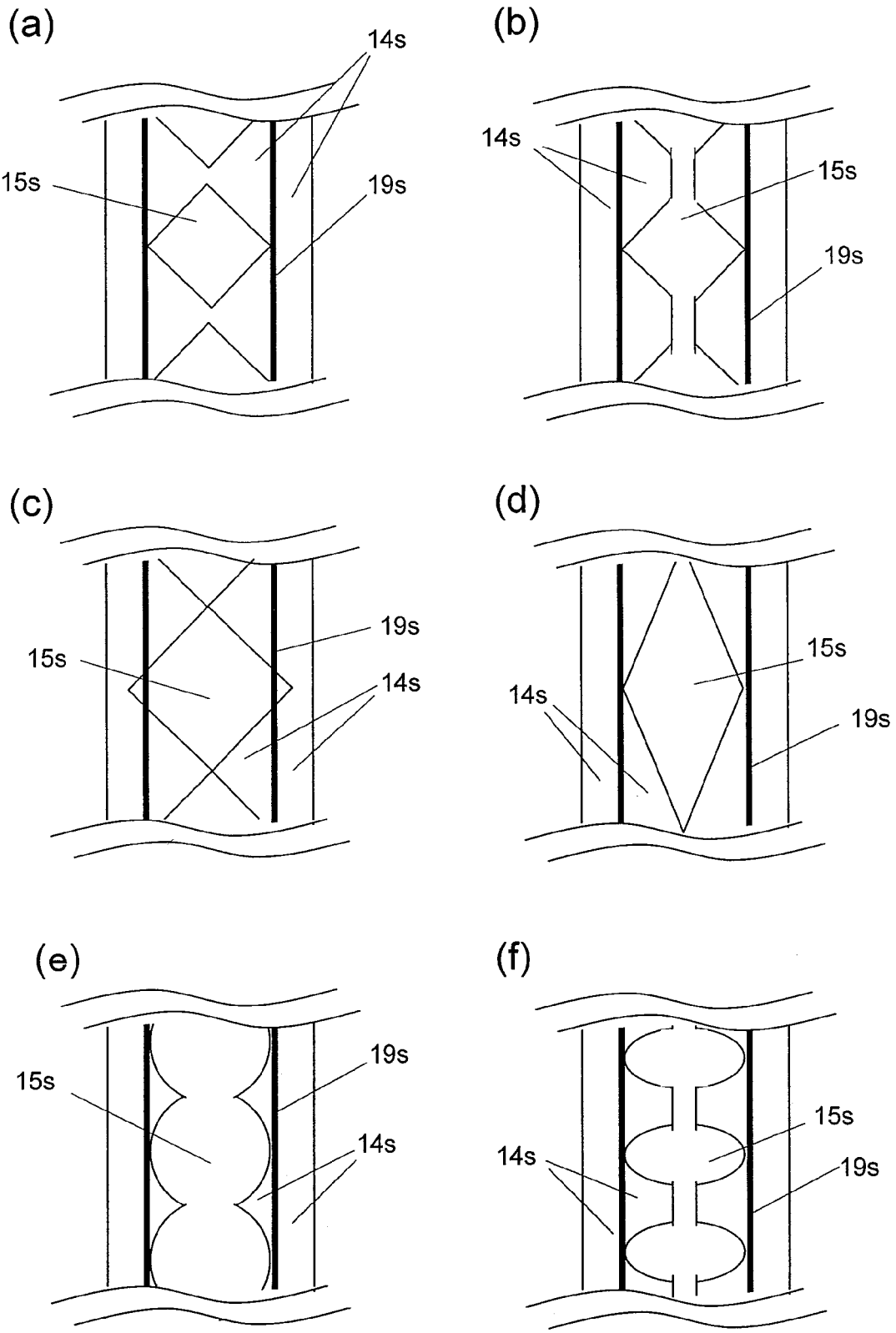

In the example illustrated in FIG. 15(a), square or rhombic portions of the p⁺-type contact region's surface 15s are arranged on the surface of the semiconductor layer so as to be spaced from each other. Each of those square or rhombic portions is shaped such that two opposing vertices thereof overlap with the profile (i.e., longer sides) of the conductive surface 19s. On the other hand, in the example illustrated in FIG. 15(b), the p⁺-type contact region's surface 15s consists of square or rhombic portions that are arranged in line so as to be spaced from each other and connecting portions, each of which is arranged between its associated adjacent ones of the square or rhombic portions to connect them together. Those square or rhombic portions are arranged such that their diagonals are aligned with the centerline of the conductive surface 19s. Each of the connecting portions is arranged so as to connect the opposing vertices of its associated, two adjacent square or rhombic portions together. Also, the width of the connecting portion is designed to be less than one-third of the width of the conductive surface 19s such that even if the degree of misalignment Δx increases to reach one-third of the width of the conductive surface 19s (as measured in the channel direction), the profile of the conductive surface 19s still does not cross the connecting portion. Meanwhile, in the example illustrated in FIG. 15(c), the shapes of the conductive surface 19s and the p⁺-type contact region's surface 15s are the same as the ones that have already been described with reference to FIGS. 14(a) through 14(c). However, in this example, the p⁺-type contact region's surface 15s is arranged such that its vertex portions project out of the longer sides of the conductive surface 19s. Furthermore, in the example illustrated in FIG. 15(d), rhombic portions of the p⁺-type contact region's surface 15s are arranged in line. Each of those rhombic portions is arranged so as to be elongated in the direction in which the conductive surface 19s runs and to have its two opposing vertices overlap with the longer sides of the conductive surface 19s. In the example illustrated in FIG. 15(e), circular portions of the p⁺-type contact region's surface 15s are arranged and joined together. And in the example illustrated in FIG. 15(f), the p⁺-type contact region's surface 15s consists of elliptical portions that are arranged so as to be spaced from each other and connecting portions, each of which is arranged between its associated, two adjacent elliptical portions to connect them together.

With such a striped conductive surface 19s that runs perpendicularly to the channel direction as in this preferred embodiment, a plurality of contact regions 15s or a plurality of main contact portions (such as the square portions shown in FIG. 15(b) or the circular portions shown in FIG. 15(e)) are arranged with respect to the single conductive surface 19s. In such examples, as the degree of misalignment Δx increases, the profile of the single conductive surface 19s crosses the respective contact regions 15s or respective main contact portions at multiple points. In that case, there are multiple portions crossed by the profile of the conductive surface 19s and the length Z of each of those crossed portions preferably changes smoothly as a the degree of misalignment Δx increases.

In this preferred embodiment, the degree of misalignment Δx as measured in a particular direction (i.e., the channel direction in this case) and the length Z just need to satisfy the relation described above, and the length Z does not have to change continuously with the degree of misalignment in every direction.

As in the preferred embodiment described above, one side of the conductive surface 19s (e.g., one of its longer sides if the conductive surface 19s is rectangular) preferably defines an angle of 30 degrees to 60 degrees in this preferred embodiment with respect to its associated side of the contact regions 15s or main contact portions. More preferably, the contact regions 15s or the main contact portions are square and the angle defined by one side of the conductive surface 19s with respect to its associated side of the contact regions 15s or main contact portions is approximately 45 degrees. Then, the variation ΔZ in length Z with the degree of misalignment Δx can be reduced, and therefore, the increase in ON-state resistance due to the misalignment can be minimized effectively.

Furthermore, if the contact regions 15s or the main contact portions are polygonal, at least one of its vertices is preferably designed so as to overlap with its associated side of the conductive surface 19s. Then, a sufficient area of contact can be secured between the source electrode and the p$^+$-type contact region 15s, the contact resistance between them can be reduced, and the increase in ON-state resistance due to the misalignment can be minimized.

It should be noted that even if the semiconductor device is designed as shown in any of FIGS. 15(a) through 15(f), the relative arrangement of the conductive surface 19s to the p$^+$-type contact region's surface 15s could actually deviate to a certain degree from the illustrated one due to a misalignment that occurs almost inevitably during the manufacturing process. However, such a slightly deviated arrangement also falls within the scope of the present invention. Naturally, an arrangement in which there is almost no misalignment between the conductive surface 19s and the p$^+$-type contact region 15s and in which the respective profiles of the conductive surface 19s and the p$^+$-type contact region 15s (i.e., the semiconductor region of the first conductivity type) do not cross each other is also encompassed within the scope of the present invention.

The configuration of the semiconductor device of this preferred embodiment is never limited to the one shown in FIGS. 13(a) and 13(b). For example, although the channel layer 16 of silicon carbide is arranged on the semiconductor layer 10 in the semiconductor device shown in FIGS. 13(a) and 13(b), the channel layer 16 may be omitted as in the semiconductor device shown in FIG. 16. In such a structure with no channel layer 16, a channel can be produced by inverting the conductivity type of the drift region under the gate electrode with a voltage applied to the gate electrode 18.

In the first and second preferred embodiments described above, a 4H-SiC substrate is used as the substrate 11. However, a SiC substrate, of which the principal surface is defined by any other crystallographic plane or which has any other poly-type, may also be used. For example, a Si substrate may be used as the substrate 11 and 3C-SiC with a cubic crystal structure may be grown as the semiconductor layer 10 by a hetero-epitaxy process. Also, even when a 4H-SiC substrate is used as the substrate 11, the semiconductor layer 10 may be arranged on its Si face and the drain electrode 21 may be arranged on its C face. Alternatively, the semiconductor layer 10 may be arranged on the C face and the drain electrode 21 may be arranged on the Si face instead.

Also, in the first and second preferred embodiments described above, the carrier density of the p$^+$-type contact region 15 is defined to be higher than that of the well region 13 to reduce the resistance between the well region 13 and the source electrode 19. However, if the carrier density of the well region 13 is sufficiently high, there is no need to provide the heavily doped p$^+$-type contact region 15. In that case, the ion implantation process step using the mask layer 35 as already described with reference to FIG. 11(d) may be omitted and the carrier density of the p$^+$-type contact region 15 may be set equal to that of the well region 13.

Furthermore, the semiconductor layer 10 includes silicon carbide. Silicon carbide is a semiconductor material that does not allow a dopant that produces p- or n-conductivity type to easily diffuse under the heat. That is why if the semiconductor layer 10 of silicon carbide is formed, then the following advantages are achieved.

First, suppose a Si layer that allows the dopant to easily diffuse thermally is used as the semiconductor layer 10. If dopant ions are implanted into a Si layer to define a dopant ion implanted region there and then activated by annealing, then the dopant ions will diffuse through Si at such a high rate that the dopant ions will diffuse thermally through the Si layer under the thermal energy produced by the activating annealing process. Consequently, the dopant ion implanted region cannot maintain its original shape after the activating annealing process, and therefore, it is very difficult to control the shape of the p$^+$-type contact region's surface 15s. On the other hand, if a silicon carbide layer that does not allow the dopant to easily diffuse thermally is used as the semiconductor layer 10, then the dopant ions will diffuse through the semiconductor layer 10 at such a low rate that the dopant ion implanted region that has been defined in the semiconductor layer 10 can maintain its original shape even after the activating annealing process. Consequently, by adjusting the shape of a mask for use in an ion implantation process, for example, the surface shape of a fine contact region can be controlled.

INDUSTRIAL APPLICABILITY

In a semiconductor device according to the present invention, including n- and p-type semiconductor regions on the surface of a semiconductor layer and a conductor that contacts with those semiconductor regions, even if misalignment has occurred between the semiconductor regions and the conductor, the increase in ON-state resistance due to such a misalignment can be minimized. In addition, since the variation in ON-state resistance can be reduced, the reliability of the semiconductor device can be increased.

The present invention is broadly applicable to any semiconductor device with a conductor that contacts with a p-type semiconductor region and an n-type semiconductor region (such as a vertical MOSFET). Among other things, the present invention is applicable particularly effectively to a fine-line semiconductor device that would be affected significantly by a misalignment that could occur during a photolithographic process. For example, it is beneficial if the present invention is applied to a semiconductor device consisting of unit cells, each having a source electrode width of 5 µm or less, more preferably 3 µm or less.

The invention claimed is:

1. A semiconductor device having a transistor, the semiconductor device comprising:
   a semiconductor layer;
   a semiconductor region of a first conductivity type, which is defined on the surface of the semiconductor layer;
   a semiconductor region of a second conductivity type, which is defined on the surface of the semiconductor layer so as to surround the semiconductor region of the first conductivity type; and
   a conductor with a conductive surface to contact with the semiconductor regions of the first and second conductivity types,
   wherein the semiconductor layer includes silicon carbide, and
   wherein at least one of the semiconductor region of the first conductivity type and the conductive surface is not circular on a plan view, and
   wherein the semiconductor region of the first conductivity type and the conductive surface are shaped such that as the degree of misalignment between the conductive surface and the semiconductor region of the first conductivity type increases from zero through one-third of the width of the conductive surface, a portion of the profile of the conductive surface that crosses the semiconductor region of the first conductivity type has smoothly changing length, thereby decreasing the length of the portion of the profile of the conductive surface that crosses the semiconductor region of the first conductivity type and therefore preventing from decreasing the effective gate width of the transistor.

2. The semiconductor device of claim 1, further comprising:
a substrate having a main surface and a back surface
a well region of the first conductivity type, which is electrically connected to the semiconductor region of the first conductivity type and which surrounds the semiconductor region of the second conductivity type on the surface of the semiconductor layer;
a gate insulating film, which partially covers the semiconductor layer;
a gate electrode, which is electrically insulated from the semiconductor layer by the gate insulating film;
an upper interconnect electrode, which is electrically connected to the conductor; and
a drain electrode;
wherein the semiconductor layer is arranged on the main surface of the substrate and the drain electrode is arranged on the back surface of the substrate.

3. The semiconductor device of claim 1, wherein on a plan view, the conductive surface and the semiconductor region of the first conductivity type are quadrangular, and the conductive surface has a side that defines an angle of 30 to 60 degrees with respect to its associated side of the semiconductor region of the first conductivity type.

4. The semiconductor device of claim 3, wherein the conductive surface and the semiconductor region of the first conductivity type are square.

5. The semiconductor device of claim 4, wherein the angle formed between the side of the conductive surface and its associated side of the semiconductor region of the first conductivity type is approximately 45 degrees.

6. The semiconductor device of claim 3, wherein the semiconductor region of the first conductivity type is shaped such that each vertex thereof overlaps with its associated side of the conductive surface.

7. The semiconductor device of claim 1, wherein as the degree of misalignment between the conductive surface and the semiconductor region of the first conductivity type increases from zero through one-third of the width of the conductive surface, multiple portions of the profile of the conductive surface cross the semiconductor region of the first conductivity type and each of those crossing portions has smoothly changing lengths.

8. The semiconductor device of claim 7, wherein on a plan view, the conductive surface and the semiconductor region of the first conductivity type are quadrangular, and
wherein a plurality of semiconductor regions of the first conductivity type are arranged under the conductive surface, and
wherein the conductive surface has a side that defines an angle of 30 to 60 degrees with respect to its associated side of the semiconductor regions of the first conductivity type.

9. The semiconductor device of claim 8, wherein each said semiconductor region of the first conductivity type is shaped such that at least two vertices thereof overlap with its associated sides of the conductive surface.

10. The semiconductor device of claim 8, wherein the conductive surface is rectangular and the semiconductor regions of the first conductivity type are arranged parallel to the longer sides of the rectangle.

11. The semiconductor device of claim 10, wherein the semiconductor regions of the first conductivity type are square.

12. The semiconductor device of claim 11, wherein the angle formed between the side of the conductive surface and its associated side of the semiconductor regions of the first conductivity type is approximately 45 degrees.

13. The semiconductor device of claim 7, wherein on a plan view, the conductive surface is quadrangular and the semiconductor region of the first conductivity type includes a plurality of square portions that are arranged so as to be spaced from each other and connecting portions, each connecting its associated pair of adjacent square portions, and
wherein the conductive surface has a side that defines an angle of 30 to 60 degrees with respect to its associated side of the square portions of the semiconductor region of the first conductivity type.

14. The semiconductor device of claim 13, wherein the conductive surface is rectangular, the square portions of the semiconductor region of the first conductivity type are arranged parallel to the longer sides of the rectangle, and each said connecting portion connects together two opposing vertices of its associated pair of adjacent square portions.

15. The semiconductor device of claim 14, wherein each said square portion of the semiconductor region of the first conductivity type is shaped such that at least two vertices thereof overlap with its associated sides of the conductive surface.

* * * * *

UNITED STATES PATENT AND TRADEMARK OFFICE
CERTIFICATE OF CORRECTION

| | | |
|---|---|---|
| PATENT NO. | : 8,125,005 B2 | Page 1 of 1 |
| APPLICATION NO. | : 12/300352 | |
| DATED | : February 28, 2012 | |
| INVENTOR(S) | : Masao Uchida et al. | |

It is certified that error appears in the above-identified patent and that said Letters Patent is hereby corrected as shown below:

Col. 28, line 3,
"changing lengths" should read --changing length--.

Signed and Sealed this
Fourth Day of September, 2012

David J. Kappos
*Director of the United States Patent and Trademark Office*